US012564066B2

(12) United States Patent
Lu et al.

(10) Patent No.: US 12,564,066 B2
(45) Date of Patent: Feb. 24, 2026

(54) SEMICONDUCTOR STRUCTURE HAVING PASSIVE COMPONENT AND METHOD OF MANUFACTURING THEREOF

(71) Applicant: TAIWAN SEMICONDUCTOR MANUFACTURING COMPANY LTD., Hsinchu (TW)

(72) Inventors: Hsiang-Tai Lu, Hsinchu County (TW); Kuan-Lung Wu, Hsinchu County (TW); Yu-Wei Chiu, Pingtung County (TW); Wen-Chien Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 393 days.

(21) Appl. No.: 18/311,223

(22) Filed: May 2, 2023

(65) Prior Publication Data

US 2024/0371797 A1     Nov. 7, 2024

(51) Int. Cl.
| | |
|---|---|
| *H01L 23/48* | (2006.01) |
| *H01L 21/48* | (2006.01) |
| *H01L 23/00* | (2006.01) |
| *H01L 23/498* | (2006.01) |
| *H01L 23/52* | (2006.01) |

(Continued)

(52) U.S. Cl.
CPC ........ *H01L 23/642* (2013.01); *H01L 21/4853* (2013.01); *H01L 21/4857* (2013.01); *H01L 23/49816* (2013.01); *H01L 23/49822* (2013.01); *H01L 23/49827* (2013.01); *H01L 23/49838* (2013.01); *H01L 24/16* (2013.01);

*H01L 25/0655* (2013.01); *H01L 2224/16221* (2013.01); *H01L 2924/1431* (2013.01)

(58) Field of Classification Search
CPC ............... H01L 23/642; H01L 21/4853; H01L 21/4857; H01L 23/49816; H01L 23/49822; H01L 23/49827; H01L 23/49838; H01L 24/16; H01L 25/0655; H01L 2224/16221; H01L 2924/1431; H01L 23/50; H01L 23/5383; H01L 23/5389
USPC ........................................ 257/773
See application file for complete search history.

(56) References Cited

U.S. PATENT DOCUMENTS

| | | | |
|---|---|---|---|
| 8,802,504 B1 | 8/2014 | Hou et al. |
| 8,803,292 B2 | 8/2014 | Chen et al. |
| 8,803,316 B2 | 8/2014 | Lin et al. |

(Continued)

*Primary Examiner* — Theresa T Doan
(74) *Attorney, Agent, or Firm* — WPAT LAW; Anthony King

(57) ABSTRACT

A semiconductor structure includes a core layer; a passive component disposed within the core layer; and a first redistribution layer disposed over the core layer, wherein the first redistribution layer includes a first interconnect, a second interconnect, and a third interconnect disposed between and electrically isolated from the first interconnect and the second interconnect. The third interconnect is electrically connected to the passive component, and at least one of the first interconnect and the second interconnect is electrically isolated from the passive component. A method of manufacturing the semiconductor structure includes providing a first bias between the first interconnect and the second interconnect, providing a second bias to the passive component through the third interconnect, wherein the first bias is greater than the second bias.

20 Claims, 19 Drawing Sheets

(51) Int. Cl.
H01L 23/64 (2006.01)
H01L 25/065 (2023.01)

(56) References Cited

U.S. PATENT DOCUMENTS

| | | | |
|---|---|---|---|
| 8,993,380 B2 | 3/2015 | Hou et al. | |
| 9,281,254 B2 * | 3/2016 | Yu | H01L 24/97 |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 12,374,652 B2 * | 7/2025 | Yang | H01L 24/13 |

* cited by examiner

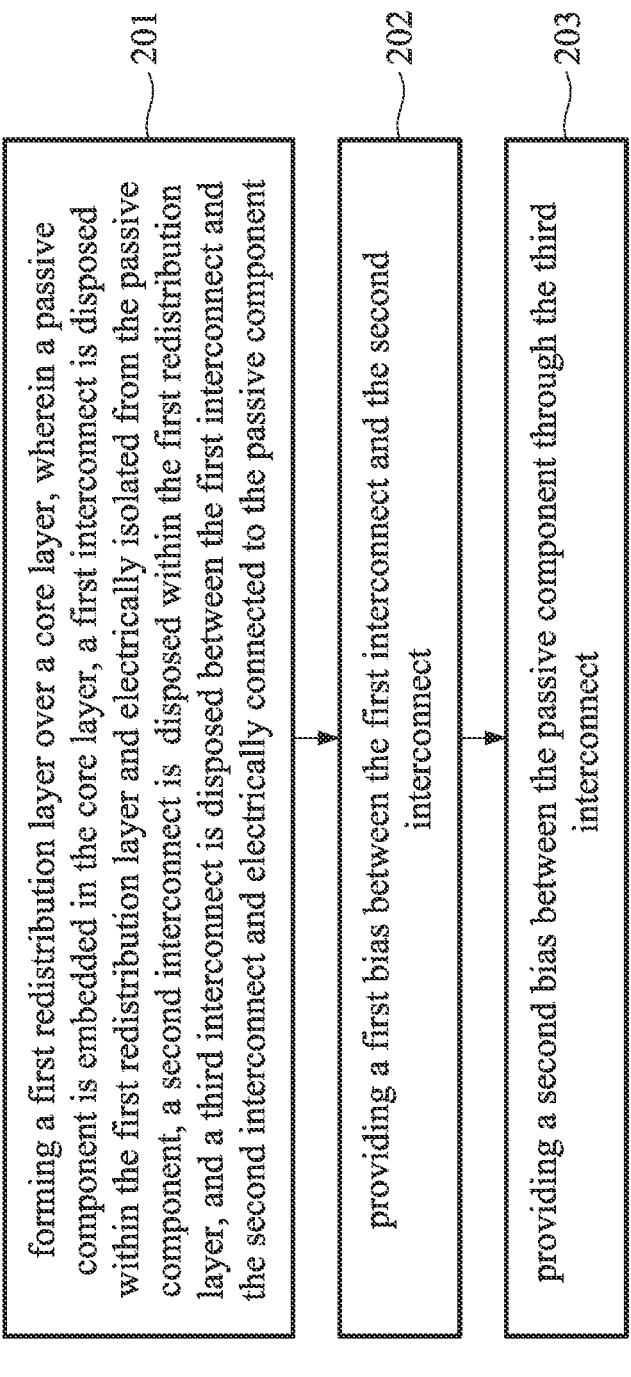

200

201 forming a first redistribution layer over a core layer, wherein a passive component is embedded in the core layer, a first interconnect is disposed within the first redistribution layer and electrically isolated from the passive component, a second interconnect is disposed within the first redistribution layer, and a third interconnect is disposed between the first interconnect and the second interconnect and electrically connected to the passive component

202 providing a first bias between the first interconnect and the second interconnect

203 providing a second bias between the passive component through the third interconnect

FIG. 11

SEMICONDUCTOR STRUCTURE HAVING PASSIVE COMPONENT AND METHOD OF MANUFACTURING THEREOF

BACKGROUND

The semiconductor industry has experienced rapid growth due to ongoing improvements in integration density of a variety of components (e.g., active components and passive components). To accommodate miniaturized scales of semiconductor devices, various technologies and applications have been developed for wafer-level packaging, involving greater numbers of different components with different functions. Improvement in integration density has resulted from iterative reduction of minimum feature size, which allows more components to be integrated into a given area.

For a semiconductor substrate having no passive component embedded therein, a 250V bias is applied to the semiconductor substrate for an early screening test for non-short circuit defects. As semiconductor technologies further advance, semiconductor structures having embedded components have emerged as an effective alternative to further reduce physical sizes of semiconductor devices. However, for a semiconductor substrate with a passive component embedded therein, a bias is limited by a breakdown voltage of the passive component, and different approaches are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 11 is a flow diagram of a method of manufacturing a semiconductor structure in accordance with some embodiments of the present disclosure.

DETAILED DESCRIPTION

Figure 1:
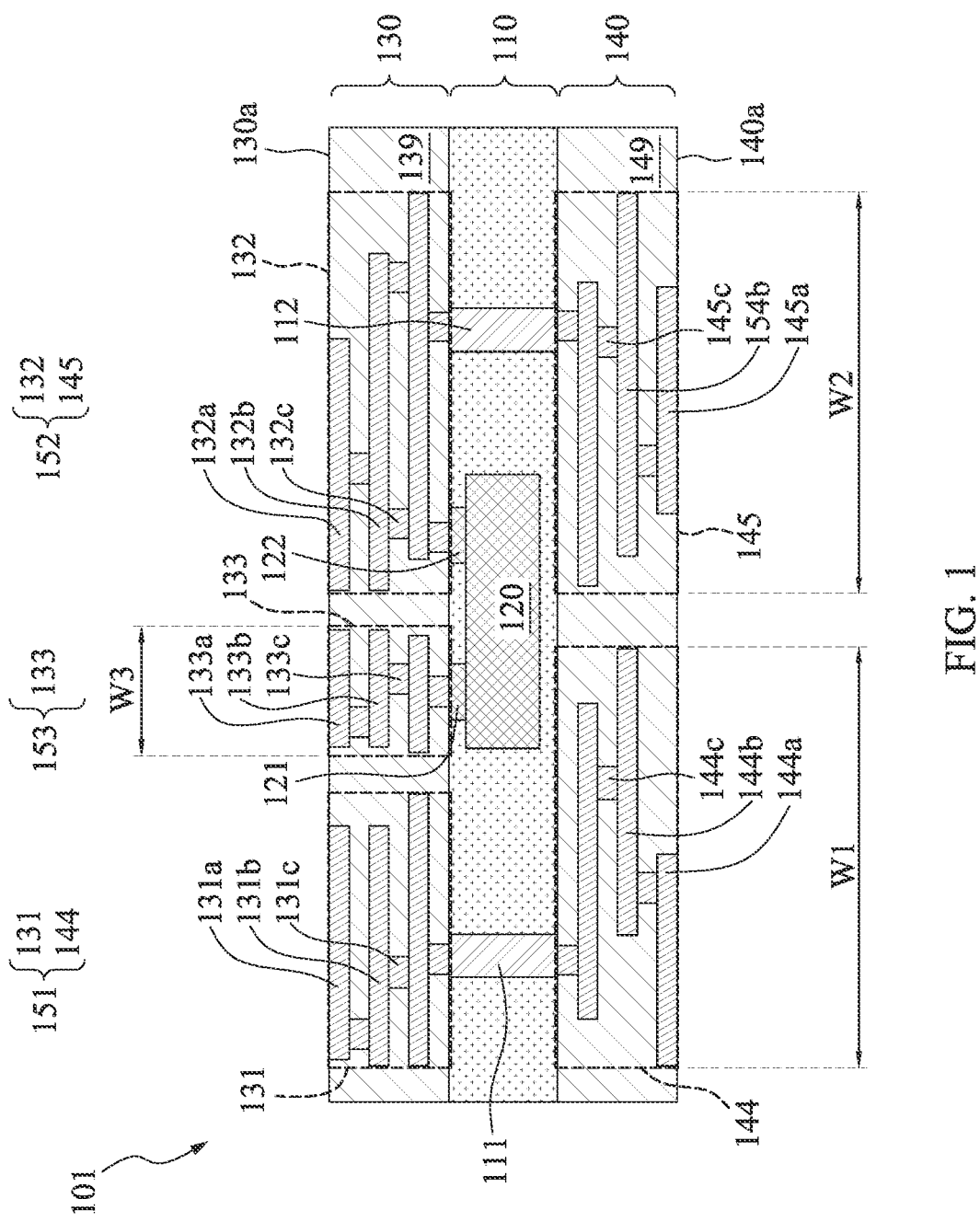
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "over." "upper." "on" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard variation found in the respective testing measurements. Also, as used herein, the terms "substantially," "approximately" and "about" generally mean within a value or range that can be contemplated by people having ordinary skill in the art. Alternatively, the terms "substantially." "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in verification testing of 3D packaging or 3DIC devices. The testing structures may include, for example, test pads formed in a redistribution layer or on a substrate that allows the testing of the 3D packaging or 3DIC, use of probes and/or probe cards, and the like. The verification testing may be performed on intermediate structures as well as a final structure. Additionally, the structures and methods disclosed herein may be used in conjunction with testing methodologies that incorporate intermediate verification of known good dies to increase yields and decrease costs.

In the present disclosure, a semiconductor structure and a method of manufacturing a semiconductor structure are provided. A semiconductor device includes a core layer, a passive component disposed within the core layer, and a first redistribution layer disposed over the core layer. The first redistribution layer includes a first interconnect, a second interconnect, and a third interconnect disposed between and electrically isolated from the first interconnect and the second interconnect. The third interconnect is electrically connected to the passive component, and at least one of the first interconnect and the second interconnect is electrically isolated from the passive component. As a result, a first bias may exist between the first interconnect and the second interconnect, a second bias may exist between the third interconnect and one of the first interconnect and the second interconnect, and the first bias may be significantly greater than the second bias.

In some embodiments, a method of manufacturing a semiconductor structure includes forming a first redistribution layer over a core layer, wherein a passive component is embedded in the core layer, a first interconnect is disposed within the first redistribution layer and electrically isolated from the passive component, a second interconnect is disposed within the first redistribution layer, and a third interconnect is disposed between the first interconnect and the second interconnect and electrically connected to the passive component. The method further includes providing a first bias between the first interconnect and the second interconnect, and providing a second bias between the passive component through the third interconnect. The first bias is greater than the second bias. Other features and processes may also be included.

Figure 2:
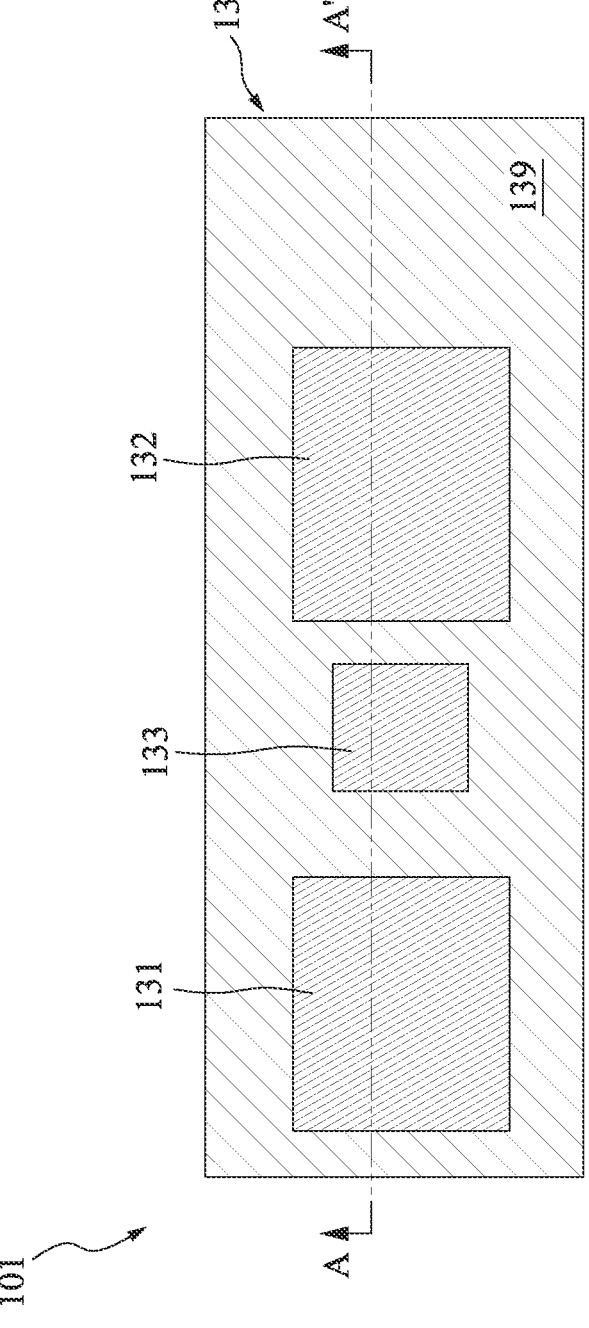
FIG. 2 is a top view of a semiconductor structure in accordance with some embodiments of the present disclosure.

FIG. 1 is a cross-sectional view of a first semiconductor structure 101 in accordance with some embodiments of the present disclosure. FIG. 2 is a top view of the first semiconductor structure 101 in accordance with some embodiments of the present disclosure. FIG. 1 is a cross-sectional view of the first semiconductor structure 101 along a line A-A' in FIG. 2.

Referring to FIGS. 1 and 2, the first semiconductor structure 101 includes a core layer 110, a passive component 120 disposed within the core layer 110, and a first redistribution layer 130 disposed over the core layer 110.

In some embodiments, the first semiconductor structure 101 is a PCB substrate or a semiconductor substrate, such as a bulk semiconductor, a semiconductor-on-insulator (SOI) substrate, or the like, and may be doped (e.g., with a p-type or an n-type dopant) or undoped. In some embodiments, the first semiconductor structure 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. The first semiconductor structure 101 may also be another type of substrate, such as a multi-layered or gradient substrate. In an embodiment, the first semiconductor structure 101 is a PCB substrate. In some embodiments, the first semiconductor structure 101 is an interposer.

In some embodiments, the semiconductor material of the core layer 110 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

In some embodiments, the first semiconductor structure 101 has a plurality of devices formed therein. The devices may include active components (e.g., transistors, diodes, or the like) and/or passive components 120 (e.g., resistors, capacitors, inductors, or the like). In some embodiments, the devices are embedded in the core layer 110 of the first semiconductor structure 101. In some embodiments, the passive component 120 is embedded in the core layer 110. In some embodiments, the passive component 120 has two terminals 121, 122. In some embodiments, the passive component 120 is a capacitor.

In some embodiments, the first redistribution layer 130 over the core layer 110 includes a first interconnect 131, a second interconnect 132, and a third interconnect 133 disposed between and electrically isolated from the first interconnect 131 and the second interconnect 132.

In some embodiments, a first dielectric layer 139 is disposed on the core layer 110 and surrounds the first interconnect 131, the second interconnect 132, and the third interconnect 133. In some embodiments, the first dielectric layer 139 is an inter-metal dielectric (IMD).

In some embodiments, the first dielectric layer 139 includes low-k dielectric material. The dielectric constant (k value) of the low-k dielectric material may be lower than 3.0, or lower than about 2.5, and the dielectric material is therefore also referred to as an extreme low-k (ELK) dielectric material. In some embodiments, the first dielectric layer 139 includes a polymer, such as, for example, polyimide, polyBenzOxazole (PBO), benzocyclobutene (BCB), ajinomoto buildup film (ABF), solder resist film (SR), or the like. In some embodiments, the first dielectric layer 139 includes a plurality of dielectric sub-layers disposed over the first semiconductor structure 101. The first dielectric layer 113, for example, may be formed by suitable fabrication techniques such as spin coating, chemical vapor deposition (CVD), plasma-enhanced chemical vapor deposition (PECVD), or the like.

In some embodiments, each of the first interconnect 131, the second interconnect 132, and the third interconnect 133 includes a plurality of conductive patterns and a plurality of conductive vias.

In some embodiments, the passive component 120 and the first interconnect 131 are offset from a top view perspective. In some embodiments, the first interconnect 131 includes a first pad 131*a* exposed through the first dielectric 139, a plurality of conductive patterns 131*b*, and a plurality of conductive vias 131*c*. The conductive patterns 131*b* and the conductive vias 131*c* are embedded in the first dielectric layer 139. In some embodiments, the conductive vias 131*c* penetrate through one of the dielectric sub-layers of the first dielectric layer 139. In some embodiments, the conductive patterns 131*b* located at different heights are connected to each other through the conductive vias 131*c*. In some embodiments, the conductive patterns 131*b* are formed in a stacked configuration, and the conductive vias 131*c* connect the conductive patterns 131*b*. In some embodiments, the conductive patterns 131*b* are electrically connected to each other through the conductive vias 131*c*. In some embodiments, the bottommost conductive via 131*c* is electrically connected to a first via 111 extending through the core layer 110.

In some embodiments, a material of the conductive patterns 131*b* and the conductive vias 131*c* includes aluminum, titanium, copper, nickel, tungsten, or alloys thereof. The conductive patterns 131*b* and the conductive vias 131*c* may be formed by, for example, electroplating, deposition, and/or photolithography and etching. In some embodiments, the conductive patterns 131*b* and the underlying conductive vias 131*c* may be formed simultaneously. It should be noted that a number of the conductive patterns 131*b* and a number of the conductive vias 131*c* illustrated in FIG. 1 are merely for illustrative purposes, and the disclosure is not limited thereto. In some alternative embodiments, fewer or more of the conductive patterns 131*b* or the conductive vias 131*c* may be formed depending on the circuit design.

In some embodiments, a portion of the second interconnect 132 is disposed over the passive component 120. In some embodiments, the passive component 120 overlaps the portion of the second interconnect 132 from a top view perspective. In some embodiments, the second interconnect 132 is in contact with one of the terminals 122 of the passive component 120. In some embodiments, the second interconnect 132 includes a second pad 132*a* exposed through the first dielectric 139, a plurality of conductive patterns 132*b* and a plurality of conductive vias 132*c*. The conductive patterns 132*b* and the conductive vias 132*c* are embedded in the first dielectric layer 139. In some embodiments, the conductive patterns 132*b* are electrically connected to each other through the conductive vias 132*c*. In some embodiments, the bottommost conductive via 132*c* is electrically connected to a second via 112 extending through the core layer 110 and/or the passive component 120. In some embodiments, the bottommost conductive vias 132*c* establish electrical connection between the passive component 120 and the second via 112.

In some embodiments, a material of the conductive patterns 132*b* and the conductive vias 132*c* is similar to the material of the conductive patterns 131*b* and the conductive vias 131*c*, and a process of forming the conductive patterns 132*b* and the conductive vias 132*c* is similar to a process of forming the conductive patterns 131*b* and the conductive vias 131*c*; thus, repeated description is omitted for a sake of brevity. It should be noted that a number of the conductive patterns 132*b* and a number of the conductive vias 132*c* illustrated in FIG. 1 are merely for illustrative purposes, and the disclosure is not limited thereto. In some alternative embodiments, fewer or more of the conductive patterns 132*b* or the conductive vias 132*c* may be formed depending on the circuit design.

In some embodiments, the third interconnect 133 is disposed over the passive component 120. In some embodiments, the passive component 120 overlaps the third interconnect 133 from a top view perspective. In some embodiments, the third interconnect 133 is in contact with one of the terminals 121 of the passive component 120. In some embodiments, the third interconnect 133 includes a third pad 133*a* exposed through the first dielectric 139, a plurality of conductive patterns 133*b* and a plurality of conductive vias 133*c*. The conductive patterns 133*b* and the conductive vias 133*c* are embedded in the first dielectric layer 139. In some embodiments, the conductive patterns 133*b* are electrically connected to each other through the conductive vias 133*c*. In some embodiments, the bottommost conductive via 133*c* is connected to the passive component 120. In some embodiments, the terminals 121, 122 of the passive component 120 are electrically connected to the third interconnect 133 and the second interconnect 132 respectively.

In some embodiments, a material of the conductive patterns 133*b* and the conductive vias 133*c* is similar to the material of the conductive patterns 131*b* and the conductive vias 131*c*, and a process of forming the conductive patterns 133*b* and the conductive vias 133*c* is similar to the process of forming the conductive patterns 131*b* and the conductive vias 131*c*; thus, repeated description is omitted for a sake of brevity. It should be noted that a number of the conductive patterns 133*b* and a number of the conductive vias 133*c* illustrated in FIG. 1 are merely for illustrative purposes, and the disclosure is not limited thereto. In some alternative embodiments, fewer or more of the conductive patterns 133*b* or the conductive vias 133*c* may be formed depending on the circuit design.

In some embodiments, a size of the first pad 131*a* is greater than a size of the third pad 133*a*. In some embodiments, a size of the second pad 132*a* is greater than the size of the third pad 133*a*. In some embodiments, the size of the first pad 131*a* is similar to the size of the second pad 132*a*. In some embodiments, the third pad 133*a* is disposed between the first pad 131*a* and the third pad 133*a*.

In some embodiments, the first interconnect 131 is electrically connected to a power source, and the second interconnect 132 is electrically connected to an electrical ground. In some embodiments, the second interconnect 132 is electrically connected to a power source, and the first interconnect 131 is electrically connected to an electrical ground.

In some embodiments, the semiconductor structure 101 further includes a second redistribution layer 140 disposed under the core layer 110. In some embodiments, the second redistribution layer 140 includes a fourth interconnect 144 electrically connected to the first interconnect 131, and a fifth interconnect 145 electrically connected to the second interconnect 132. In some embodiments, the core layer 110 is disposed between the first redistribution layer 130 and the second redistribution layer 140. In some embodiments, the fourth interconnect 144 is disposed under the first interconnect 131. In some embodiments, the fourth interconnect 144 is electrically connected to the first interconnect 131 through the first via 111. In some embodiments, the fifth interconnect 145 is disposed under the second interconnect 132. In some embodiments, the fifth interconnect 145 is electrically connected to the second interconnect 132 through the second via 112. In some embodiments, the passive component 120 is disposed between the first via 111 and the second via 112.

In some embodiments, a second dielectric layer 149 is disposed under the core layer 110 and surrounds the fourth interconnect 144 and the fifth interconnect 145. In some embodiments, the second dielectric layer 149 is an inter-metal dielectric (IMD). In some embodiments, a material of the second dielectric layer 149 is similar to the material of the first dielectric layer 139, and repeated description is omitted for a sake of brevity.

In some embodiments, each of the fourth interconnect 144 and the fifth interconnect 145 includes a plurality of conductive patterns and a plurality of conductive vias.

In some embodiments, the fourth interconnect 144 is disposed under the passive component 120 and the first via 111. In some embodiments, the fourth interconnect 144 is in contact with the first via 111. In some embodiments, the fourth interconnect 144 includes a fourth pad 144a exposed through the second dielectric 149, a plurality of conductive patterns 144b and a plurality of conductive vias 144c. The conductive patterns 144b and the conductive vias 144c are embedded in the second dielectric layer 149. In some embodiments, the conductive patterns 144b are electrically connected to each other through the conductive vias 144c. In some embodiments, the topmost conductive via 144c is connected to the first via 111.

In some embodiments, a material of the conductive patterns 144b and the conductive vias 144c is similar to the material of the conductive patterns 131b and the conductive vias 131c, and a process of forming the conductive patterns 144b and the conductive vias 144c is similar to the process of forming the conductive patterns 131b and the conductive vias 131c; thus, repeated description is omitted for a sake of brevity. It should be noted that a number of the conductive patterns 144b and a number of the conductive vias 144c illustrated in FIG. 1 are merely for illustrative purposes, and the disclosure is not limited thereto. In some alternative embodiments, fewer or more of the conductive patterns 144b or the conductive vias 144c may be formed depending on the circuit design.

In some embodiments, the fifth interconnect 145 is disposed under the passive component 120 and the second via 112. In some embodiments, the fifth interconnect 145 is in contact with the second via 112. In some embodiments, the fifth interconnect 145 includes a fifth pad 145a exposed through the second dielectric 149, a plurality of conductive patterns 145b, and a plurality of conductive vias 145c. The conductive patterns 145b and the conductive vias 145c are embedded in the second dielectric layer 149. In some embodiments, the conductive patterns 145b are electrically connected to each other through the conductive vias 145c. In some embodiments, the topmost conductive via 145c is connected to the second via 112.

In some embodiments, a material of the conductive patterns 145b and the conductive vias 145c is similar to the material of the conductive patterns 131b and the conductive vias 131c, and a process of forming the conductive patterns 145b and the conductive vias 145c is similar to the process of forming the conductive patterns 131b and the conductive vias 131c; thus, repeated description is omitted for a sake of brevity. It should be noted that a number of the conductive patterns 145b and a number of the conductive vias 145c illustrated in FIG. 1 are merely for illustrative purposes, and the disclosure is not limited thereto. In some alternative embodiments, fewer or more of the conductive patterns 145b or the conductive vias 145c may be formed depending on the circuit design.

In some embodiments, the fourth pad 144a and the fifth pad 145a are configured to electrically connect to the power source or the electrical ground respectively. In some embodiments, a size of the fourth pad 144a is greater than a size of the third pad 133a. In some embodiments, a size of the fifth pad 145a is greater than the size of the third pad 133a. In some embodiments, the size of the fourth pad 144a is similar to the size of the fifth pad 145a.

In some embodiments, the fourth interconnect 144 is electrically connected to the power source, and the fifth interconnect 145 is electrically connected to the electrical ground. In some embodiments, the fifth interconnect 145 is electrically connected to the power source, and the fourth interconnect 144 is electrically connected to the electrical ground.

In some embodiments, a first interconnect group 151 including the fourth interconnect 144 and the first interconnect 131 is disposed within the first redistribution layer 130 and the second redistribution layer 140. The fourth interconnect 144 is electrically connected to the first interconnect 131. In some embodiments, the first interconnect group 151 further includes the first via 111 between the fourth interconnect 144 and the first interconnect 131. In some embodiments, the first interconnect group 151 is electrically isolated from the passive component 120.

In some embodiments, a second interconnect group 152 including the second interconnect 132 and the fifth interconnect 145 is disposed within the first redistribution layer 130 and the second redistribution layer 140. The second interconnect 132 is electrically connected to the fifth interconnect 145. In some embodiments, the second interconnect group 152 further includes the second via 112 between the fifth interconnect 145 and the second interconnect 132. In some embodiments, the second interconnect group 152 is electrically connected to the passive component 120.

In some embodiments, a third interconnect group 153 including the third interconnect 133 is disposed between the first interconnect group 151 and the second interconnect group 152. In some embodiments, the third interconnect group 153 is disposed within the first redistribution layer 130 and away from the second redistribution layer 140. In some embodiments, the third interconnect group 153 is electrically isolated from the first interconnect group 151. In some embodiments, the third interconnect group 153 is electrically connected to the passive component 120.

In some embodiments, a width W1 of the first interconnect group 151 is greater than a width W3 of the third interconnect group 153. In some embodiments, a width W2 of the second interconnect group 152 is greater than the width W3 of the third interconnect group 153. In some embodiments, the width W1 of the first interconnect group 151 is similar to the width W2 of the second interconnect group 152.

Figure 3:
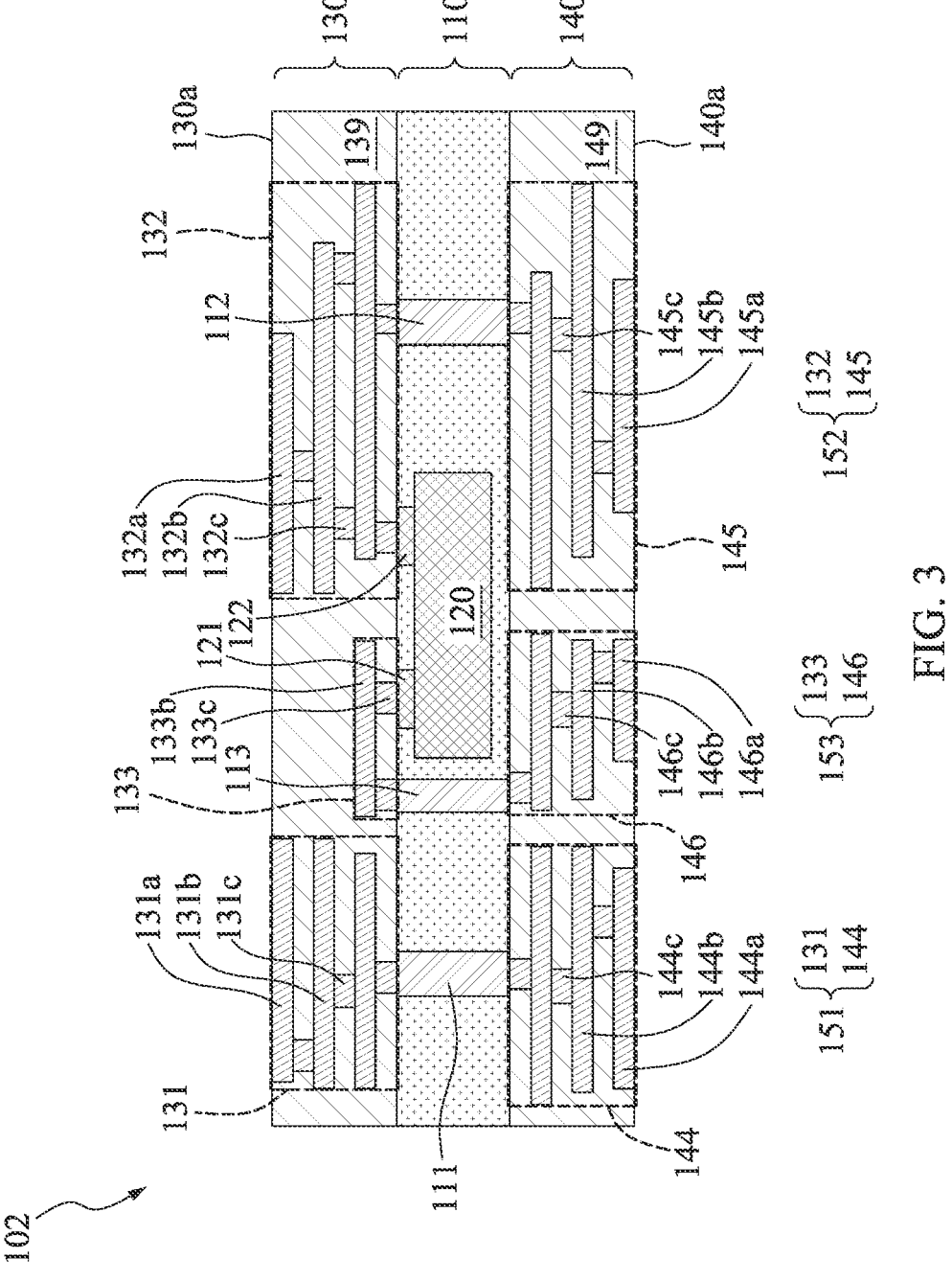
FIG. 3 is a cross-sectional view of a semiconductor structure in accordance with some embodiments of the present disclosure.
Figure 4:
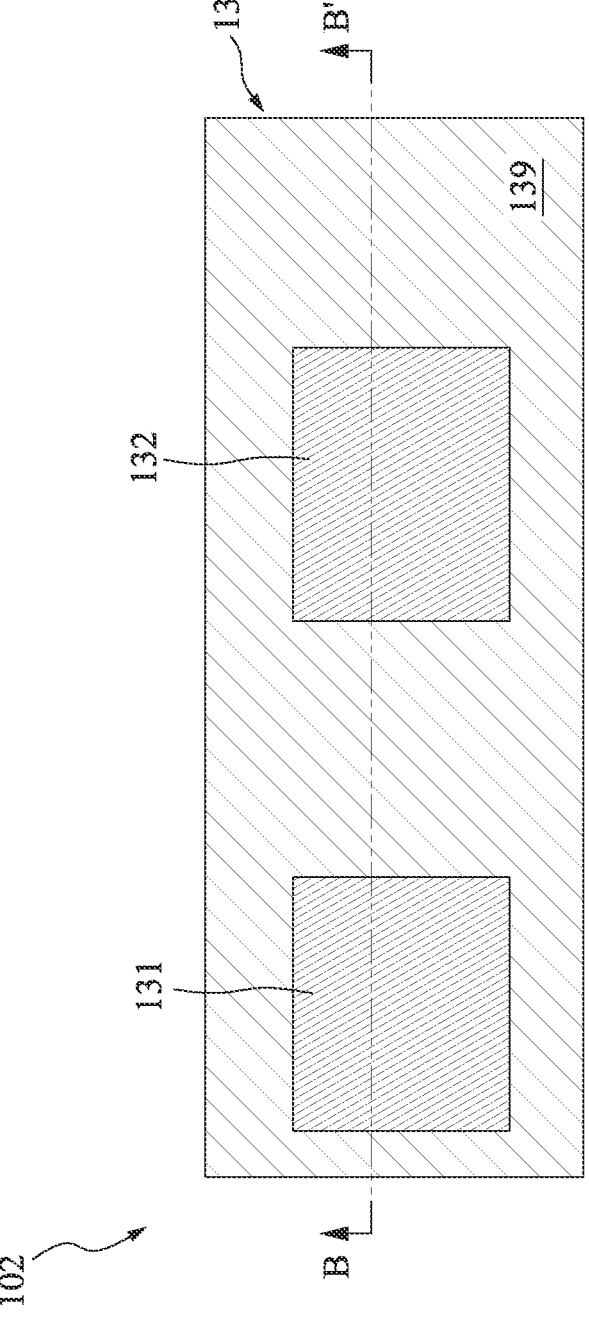
FIG. 4 is a top view of a semiconductor structure in accordance with some embodiments of the present disclosure.

FIG. 3 is a cross-sectional view of a second semiconductor structure 102 in accordance with some embodiments of the present disclosure. FIG. 4 is a top view of the second semiconductor structure 102 in accordance with some embodiments of the present disclosure. FIG. 3 is a cross-sectional view of the second semiconductor structure 102 along a line B-B' in FIG. 4. The second semiconductor structure 102 illustrated in FIGS. 3 and 4 is similar to the first semiconductor structure 101 illustrated in FIGS. 1 and 2, except that, in the second semiconductor structure 102, the second redistribution layer 140 further includes a sixth interconnect 146 electrically connected to the passive component 120 through the third interconnect 133, and the sixth interconnect 146 is disposed between and electrically isolated from the fourth interconnect 144 and the fifth interconnect 145. In some embodiments, the third interconnect group 153 includes the third interconnect 133 and the sixth interconnect 146 and is disposed within the first redistribution layer 130 and the second redistribution layer 140.

In some embodiments, the sixth interconnect 146 is electrically connected to the third interconnect 133 through a third via 113. In some embodiments, the third via 113 is disposed between the first via 111 and the passive component 120 and extends through the core layer 110. In some embodiments, the third interconnect 133 electrically connected to the sixth interconnect 146 is embedded in the first dielectric layer 139 and the third pad 133a is omitted.

In some embodiments, the sixth interconnect 146 is disposed under the passive component 120 and the third via 113. In some embodiments, the sixth interconnect 146 is in contact with the third via 113. In some embodiments, the sixth interconnect 146 includes a sixth pad 146a exposed through the second dielectric 149, a plurality of conductive patterns 146b, and a plurality of conductive vias 146c. The conductive patterns 146b and the conductive vias 146c are embedded in the second dielectric layer 149. In some embodiments, the conductive patterns 146b are electrically connected to each other through the conductive vias 146c. In some embodiments, the topmost conductive via 146c is connected to the third via 113.

In some embodiments, a material of the conductive patterns 146b and the conductive vias 146c is similar to the material of the conductive patterns 131b and the conductive vias 131c, and a process of forming the conductive patterns 146b and the conductive vias 146c is similar to the process of forming the conductive patterns 131b and the conductive vias 131c; thus, repeated description is omitted for a sake of brevity. It should be noted that a number of the conductive patterns 146b and a number of the conductive vias 146c illustrated in FIG. 3 are merely for illustrative purposes, and the disclosure is not limited thereto. In some alternative embodiments, fewer or more of the conductive patterns 146b, or the conductive vias 146c may be formed depending on the circuit design.

In some embodiments, the sixth pad 146a and the second pad 132a are configured to receive the second bias. In some embodiments, the sixth pad 146a and the fifth pad 145a are configured to receive the second bias.

Figure 5:
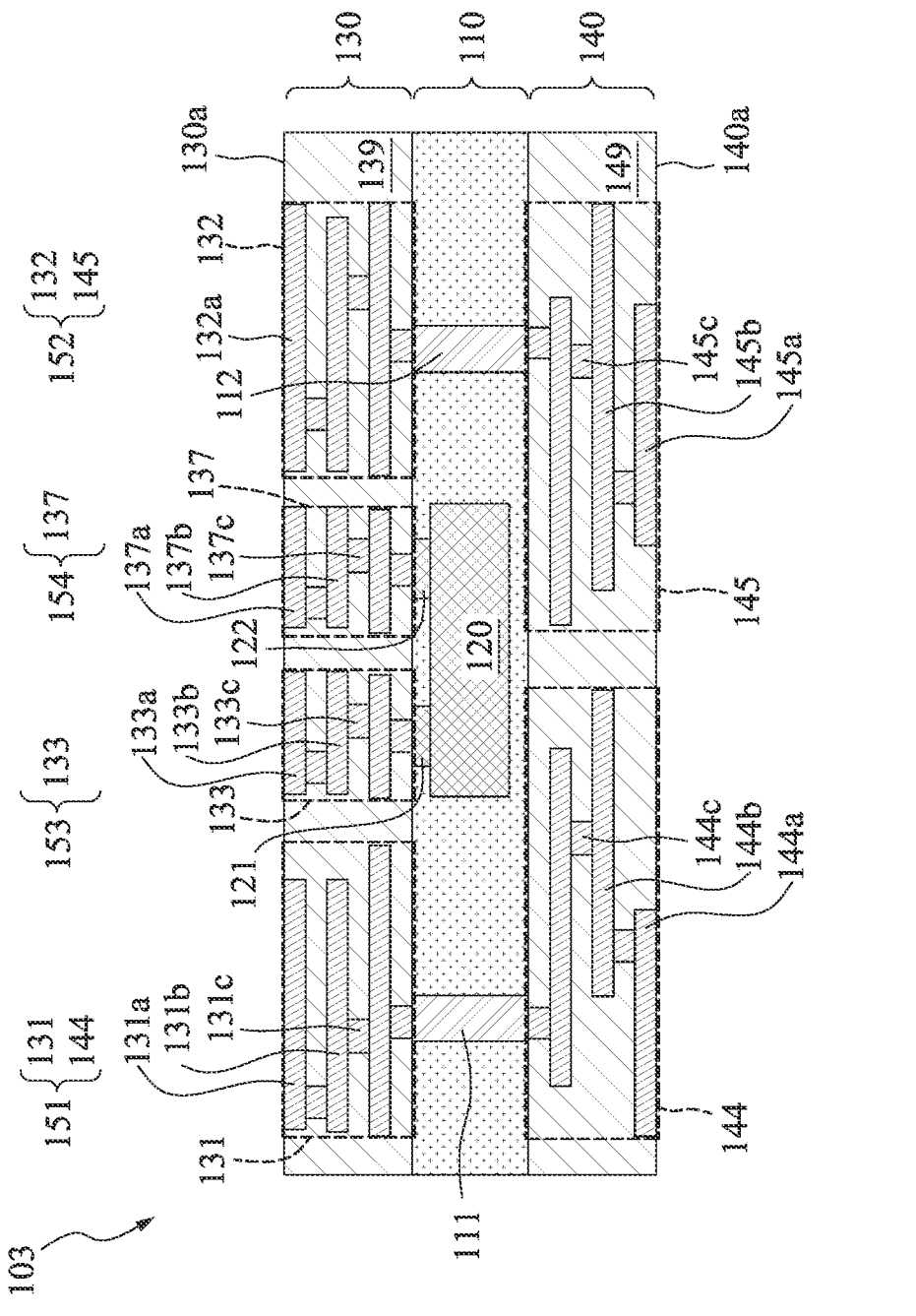
FIG. 5 is a cross-sectional view of a semiconductor structure in accordance with some embodiments of the present disclosure.
Figure 6:
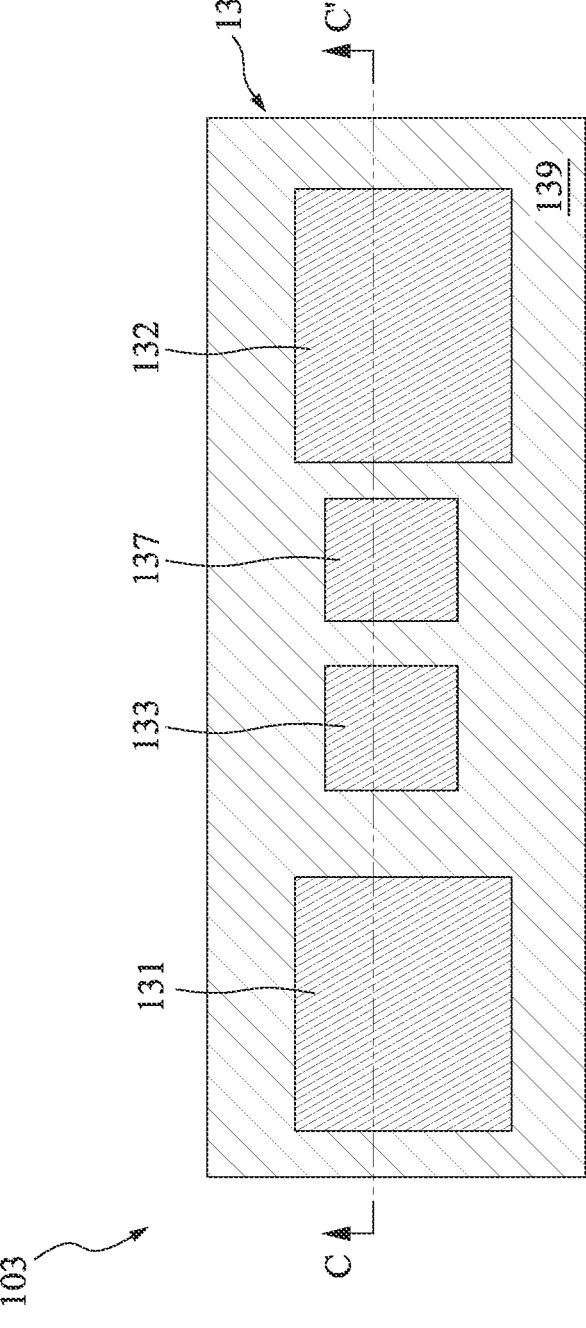
FIG. 6 is a top view of a semiconductor structure in accordance with some embodiments of the present disclosure.

FIG. 5 is a cross-sectional view of a third semiconductor structure 103 in accordance with some embodiments of the present disclosure. FIG. 6 is a top view of the third semiconductor structure 103 in accordance with some embodiments of the present disclosure. FIG. 5 is a cross-sectional view of the third semiconductor structure 103 along a line C-C' in FIG. 6. The third semiconductor structure 103 illustrated in FIGS. 5 and 6 is similar to the first semiconductor structure 101 illustrated in FIGS. 1 and 2, except that, in the third semiconductor structure 103, the first redistribution layer 130 further includes a seventh interconnect 137 electrically connected to the passive component 120, and the first interconnect 131 and the second interconnect 132 are electrically isolated from the seventh interconnect 137. In some embodiments, the seventh interconnect 137 is disposed adjacent to the third interconnect 133. In some embodiments, the third interconnect 133 and the seventh interconnect 137 are disposed adjacent between the first interconnect 131 and the second interconnect 132.

In some embodiments, the seventh interconnect 137 is disposed over the passive component 120. In some embodiments, the passive component 120 overlaps the seventh interconnect 137 from a top view perspective. In some embodiments, the seventh interconnect 137 is in contact with one of the terminals 122 of the passive component 120. In some embodiments, the third interconnect 133 and the seventh interconnect 137 are electrically connected to the terminals 121, 122 of the passive component 120.

In some embodiments, the seventh interconnect 137 includes a seventh pad 137a exposed through the first dielectric 139, a plurality of conductive patterns 137b, and a plurality of conductive vias 137c. In some embodiments, configurations of the conductive patterns 137b and the conductive vias 137c are similar to the configurations of the conductive patterns 131b and the conductive vias 131c, and repeated description is omitted for a sake of brevity. In some embodiments, the bottommost conductive via 137c is connected to the passive component 120.

In some embodiments, a material of the conductive patterns 137b and the conductive vias 137c is similar to the material of the conductive patterns 131b and the conductive vias 131c, and a process of forming the conductive patterns 137b and the conductive vias 137c is similar to the process of forming the conductive patterns 131b and the conductive vias 131c; thus, repeated description is omitted for a sake of brevity. It should be noted that a number of the conductive patterns 137b and a number of the conductive vias 137c illustrated in FIG. 5 are merely for illustrative purposes, and the disclosure is not limited thereto. In some alternative embodiments, fewer or more of the conductive patterns 137b or the conductive vias 137c may be formed depending on the circuit design. In some embodiments, a size of the seventh pad 137a is similar to the size of the third pad 133a.

In some embodiments, the second interconnect group 152 is electrically isolated from the passive component 120. In some embodiments, a fourth interconnect group 154 including the seventh interconnect 137 is disposed within the first redistribution layer 130. The seventh interconnect 137 is electrically connected to the passive component 120. In some embodiments, the fourth interconnect group 154 is disposed between the second interconnect group 152 and the third interconnect group 153.

Figure 7:
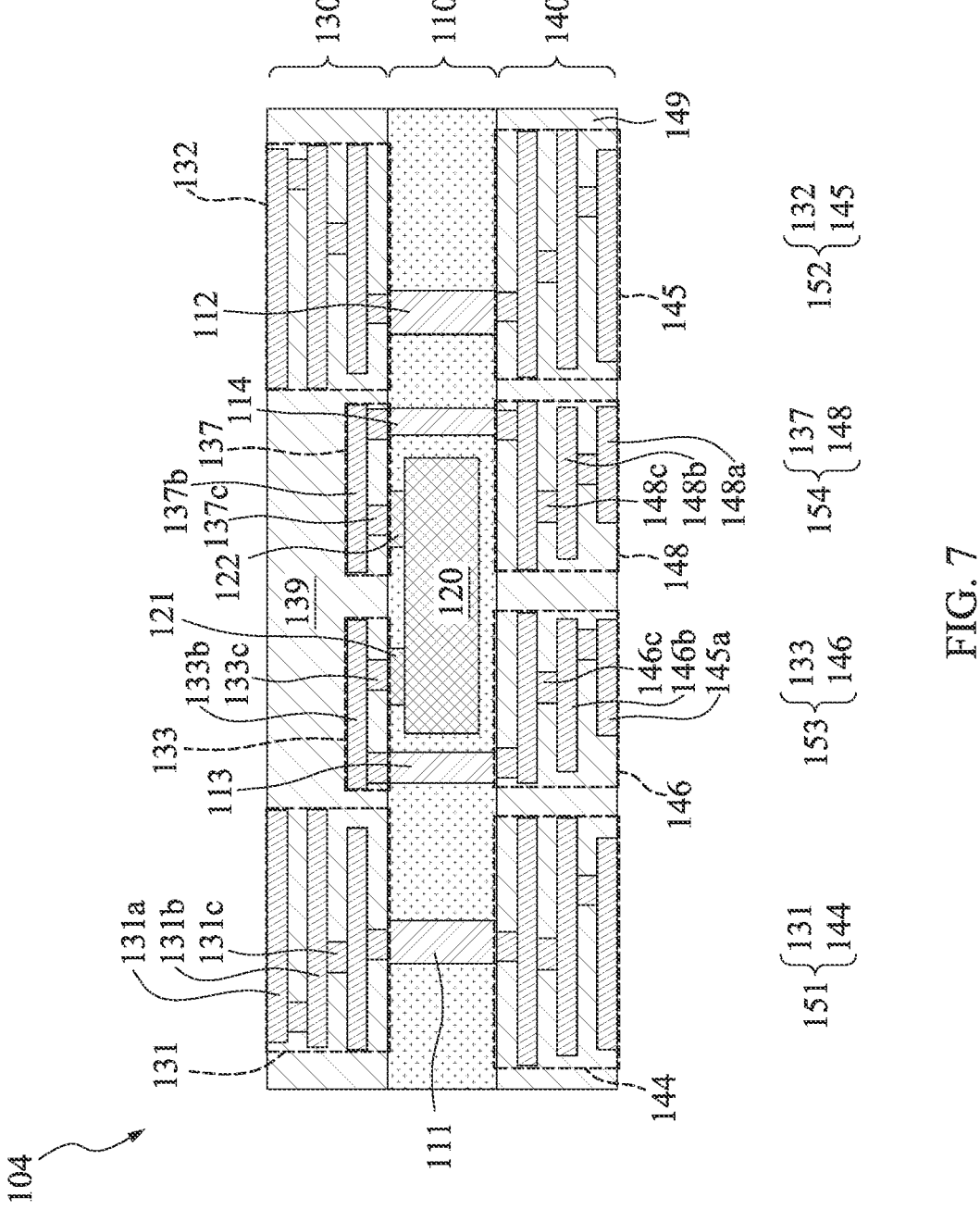
FIG. 7 is a cross-sectional view of a semiconductor structure in accordance with some embodiments of the present disclosure.

FIG. 7 is a cross-sectional view of a fourth semiconductor structure 104 in accordance with some embodiments of the present disclosure. The fourth semiconductor structure 104 illustrated in FIG. 7 is similar to the second semiconductor structure 102 illustrated in FIGS. 3 and 4, except that, in the fourth semiconductor structure 104, the first redistribution layer 130 further includes the seventh interconnect 137 electrically connected to the passive component 120, and the second redistribution layer 140 further includes an eighth interconnect 148 electrically connected to the passive component 120 and electrically isolated from the fourth interconnect 144 and the fifth interconnect 145. In some embodiments, the eighth interconnect 148 is electrically connected to the passive component 120 through a fourth via 114 and the seventh interconnect 137. In some embodiments, the eighth interconnect 148 is disposed adjacent to the sixth interconnect 146. In some embodiments, the sixth interconnect 146 and the eighth interconnect 148 are disposed between the fourth interconnect 144 and the fifth interconnect 145. In some embodiments, the eighth interconnect 148 is electrically connected to the seventh interconnect 137 through the fourth via 114. In some embodiments, the fourth via 114 is disposed between the second via 112 and the passive component 120 and extends through the core layer 110. In some embodiments, the passive component 120 is disposed between the third via 113 and the fourth via 114. In some embodiments, the seventh interconnect 137 electrically connected to the eighth interconnect 148 is embedded in the first dielectric layer 139, and the seventh pad 137a is omitted. In such embodiments, the third interconnect 133 electrically connected to the sixth interconnect 146 is embedded in the first dielectric layer 139, and the third pad 133a is omitted.

In some embodiments, the eighth interconnect 148 is disposed under the passive component 120. In some embodiments, the passive component 120 overlaps the eighth interconnect 148 from a top view perspective. In some embodiments, the seventh interconnect 137 overlaps the eighth interconnect 148 from a top view perspective. In some embodiments, the eighth interconnect 148 is in contact with the fourth via 114. In some embodiments, the eighth interconnect 148, the fourth via 114 and the seventh interconnect 137 are electrically connected to the terminal 122 of the passive component 120.

In some embodiments, the eighth interconnect 148 includes an eighth pad 148a exposed through the second dielectric layer 149, a plurality of conductive patterns 148b, and a plurality of conductive vias 148c. In some embodiments, configurations of the conductive patterns 148b and the conductive vias 148c are similar to the configurations of the conductive patterns 146b and the conductive vias 146c of the sixth interconnect 146, and repeated description is omitted for a sake of brevity. In some embodiments, the topmost conductive via 148c is connected to the fourth via 114.

In some embodiments, a material of the conductive patterns 148b and the conductive vias 148c is similar to the material of the conductive patterns 146b and the conductive vias 146c, and a process of forming the conductive patterns 148b and the conductive vias 148c is similar to the process of forming the conductive patterns 146b and the conductive vias 146c; thus, repeated description is omitted for a sake of brevity. It should be noted that a number of the conductive patterns 148b and a number of the conductive vias 148c illustrated in FIG. 7 are merely for illustrative purposes, and the disclosure is not limited thereto. In some alternative embodiments, fewer or more of the conductive patterns 148b or the conductive vias 148c may be formed depending on the circuit design.

In some embodiments, the sixth pad 146a and the eighth pad 148a are configured to receive the second bias, and the first pad 131a and the second pad 132a are configured to receive the first bias. In some embodiments, the size of the fourth pad 144a is greater than a size of the eighth pad 148a. In some embodiments, the size of the sixth pad 146a is similar to the size of the eighth pad 148a.

Figure 8:
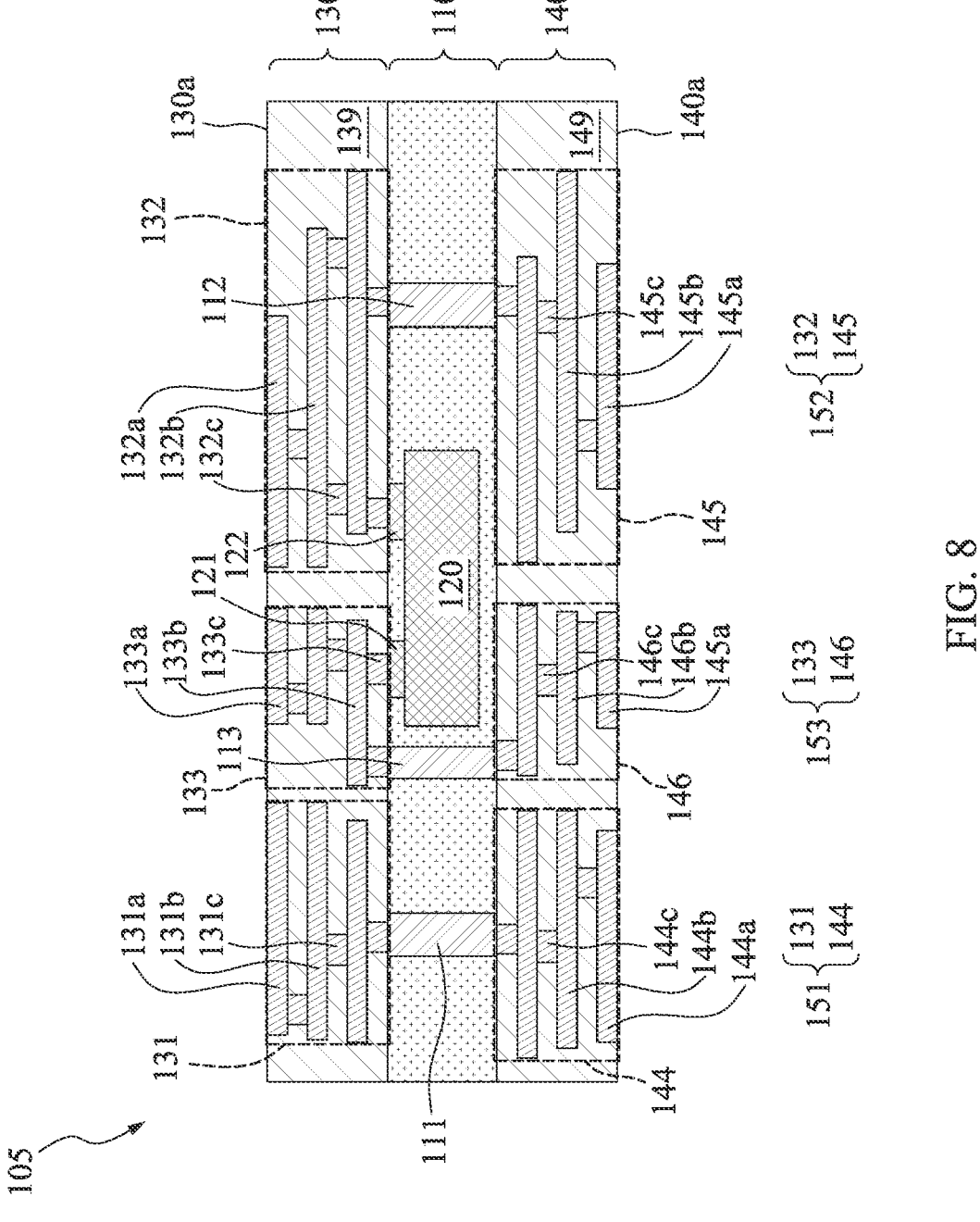
FIG. 8 is a cross-sectional view of a semiconductor structure in accordance with some embodiments of the present disclosure.

FIG. 8 is a cross-sectional view of a fifth semiconductor structure 105 in accordance with some embodiments of the present disclosure. The fifth semiconductor structure 105 illustrated in FIG. 8 is similar to the second semiconductor structure 102 illustrated in FIGS. 3 and 4, except that, in the fifth semiconductor structure 105, the third interconnect 133 includes the third pad 133a exposed through the first dielectric layer 139 of the first redistribution layer 130.

In some embodiments, the sixth pad 146a and the second pad 132a are configured to receive the second bias. In some embodiments, the sixth pad 146a and the fifth pad 145a are configured to receive the second bias.

Figure 9:
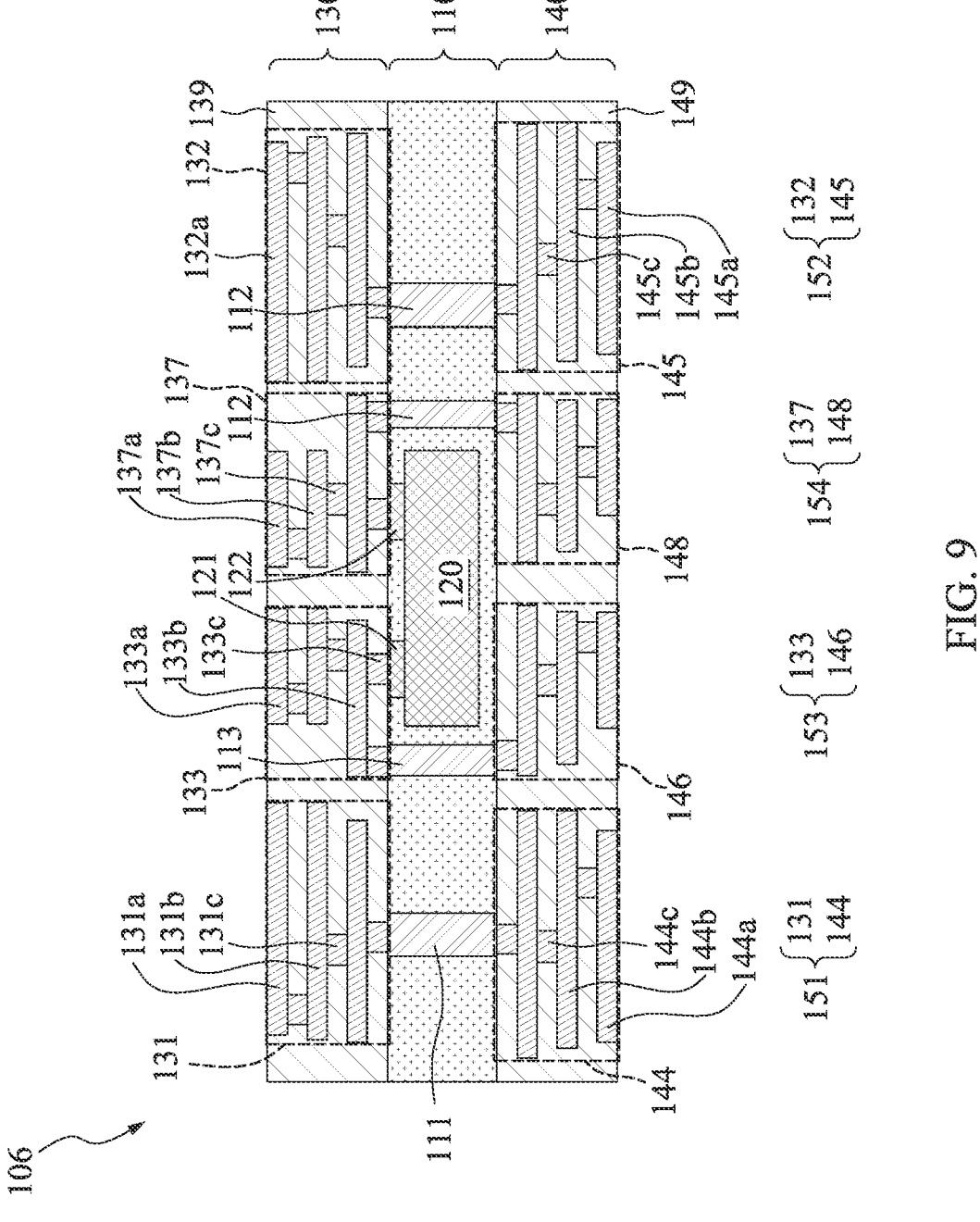
FIG. 9 is a cross-sectional view of a semiconductor structure in accordance with some embodiments of the present disclosure.

FIG. 9 is a cross-sectional view of a sixth semiconductor structure 106 in accordance with some embodiments of the present disclosure. The sixth semiconductor structure 106 illustrated in FIG. 9 is similar to the third semiconductor structure 103 illustrated in FIGS. 5 and 6, except that, in the sixth semiconductor structure 106, the second redistribution layer 140 further includes the sixth interconnect 146 electrically connected to the passive component 120 through the third interconnect 133, and the eighth interconnect 148 electrically connected to the passive component 120 through the seventh interconnect 137. In some embodiments, the third interconnect 133 and the seventh interconnect 137 are disposed between the first interconnect 131 and the second interconnect 132, and the sixth interconnect 146 and the eighth interconnect 148 are disposed between the fourth interconnect 144 and the fifth interconnect 145. In some embodiments, the first interconnect 131 is electrically connected to the fourth interconnect 144 through the first via 111, the second interconnect 132 is electrically connected to the fifth interconnect 145 through the second via 112, the third interconnect 133 is electrically connected to the sixth interconnect 146 through the third via 113, and the seventh interconnect 137 is electrically connected to the eighth interconnect 148 through the fourth via 114. In some embodiments, the first pad 131a, the second pad 132a, the third pad 133a and the seventh pad 137a are exposed through the first dielectric layer 139, and the fourth pad 144a, the fifth pad 145a, the sixth pad 146a and the eighth pad 148a are exposed through the second dielectric layer 149.

In some embodiments, the first interconnect group 151 and the second interconnect group 152 are electrically isolated from the passive component 120. In some embodiments, the third interconnect group 153 includes the third interconnect 133 and the sixth interconnect 146, and the fourth interconnect group 154 includes the seventh interconnect 137 and the eighth interconnect 148. In some embodiments, the third interconnect group 153 and the fourth interconnect group 154 are electrically connected to the passive component 120.

Figure 10:
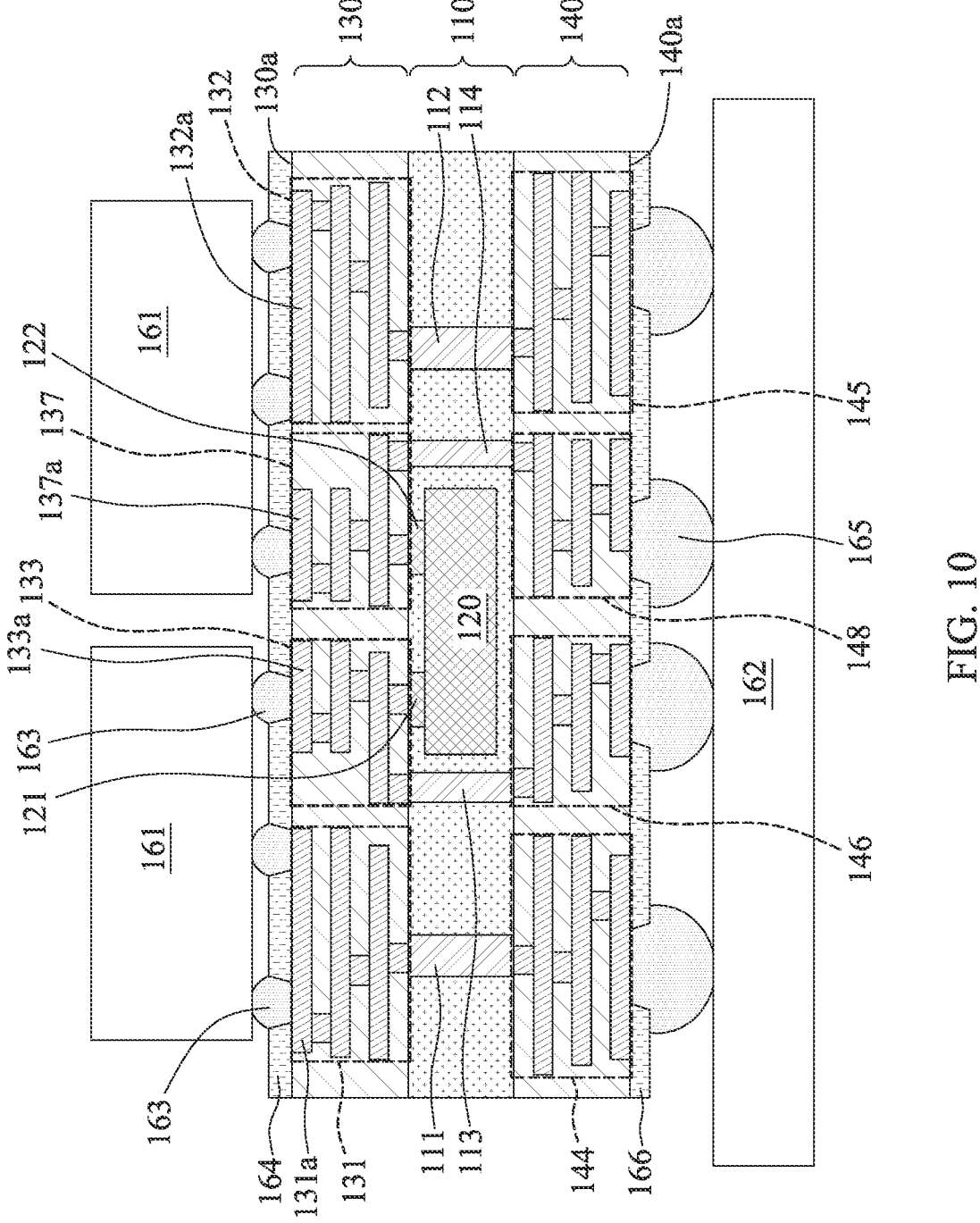
FIG. 10 is a cross-sectional view of a semiconductor structure in accordance with some embodiments of the present disclosure.

FIG. 10 is a cross-sectional view of the sixth semiconductor structure 106 in accordance with some embodiments of the present disclosure. In some embodiments, the first redistribution layer 130 includes a first side 130a configured to electrically connect to a die 161, and the second redistribution layer 140 includes a second side 140a configured to electrically connect to a circuit board 162.

In some embodiments, the first redistribution layer 130 is electrically connected to a plurality of dies 161. In some embodiments, the die 161 is a logic die, which may be a central processing unit (CPU) die, a micro-control unit (MCU) die, an input-output (IO) die, a baseband (BB) die, an application processor (AP) die, or the like. In some embodiments, the die 161 is a memory die such as a dynamic random-access memory (DRAM) die or a static random-access memory (SRAM) die, or may be another type of die.

In some embodiments, the first redistribution layer 130 electrically connects to the die 161 through a plurality of conductive bumps 163. In some embodiments, the conductive bumps 163 and a passivation layer 164 are disposed over the first side 130a of the first redistribution layer 130, and the conductive bumps 163 are surrounded by the passivation layer 164. In some embodiments, the conductive bump 163 is disposed on the first redistribution layer 130 by a ball placement process and/or a reflowing process. In some embodiments, the formation of the conductive bumps 163 includes performing a plating step to form solder regions, and then reflowing the solder regions. In some embodiments, the conductive bumps 163 are solder bumps.

In some embodiments, the second redistribution layer 140 electrically connects to the circuit board 162 through a plurality of conductive balls 165. In some embodiments, the conductive balls 165 and a passivation layer 166 are disposed under the second side 140a of the second redistribution layer 140, and the conductive balls 165 are surrounded by the passivation layers 166. In some embodiments, the conductive balls 165 are a ball grid array (BGA). In some embodiments, the sixth semiconductor structure 106 is disposed between the die 161 and the circuit board 162. In some embodiments, each of the first semiconductor structure 101, the second semiconductor structure 102, the third semiconductor structure 103, the fourth semiconductor structure 104 and the fifth semiconductor structure 105 may be disposed between and electrically connected to the die 161 and the circuit board 162.

In the present disclosure, a method of manufacturing the semiconductor structures 101, 102, 103, 104, 105 and 106 is also disclosed. In some embodiments, the semiconductor structures 101, 102, 103, 104, 105 and 106 are fabricated by a method 200. The method 200 includes a number of operations and the description and illustration are not deemed as a limitation to the sequence of operations. FIG. 11 is an embodiment of the method 200 of manufacturing the first semiconductor structure 101. The method 200 includes a number of operations 201, 202 and 203. FIGS. 12 to 19 are cross-sectional views of one or more operations of the method 200 for manufacturing a semiconductor structure in accordance with some embodiments of the present disclosure.

Figure 12:
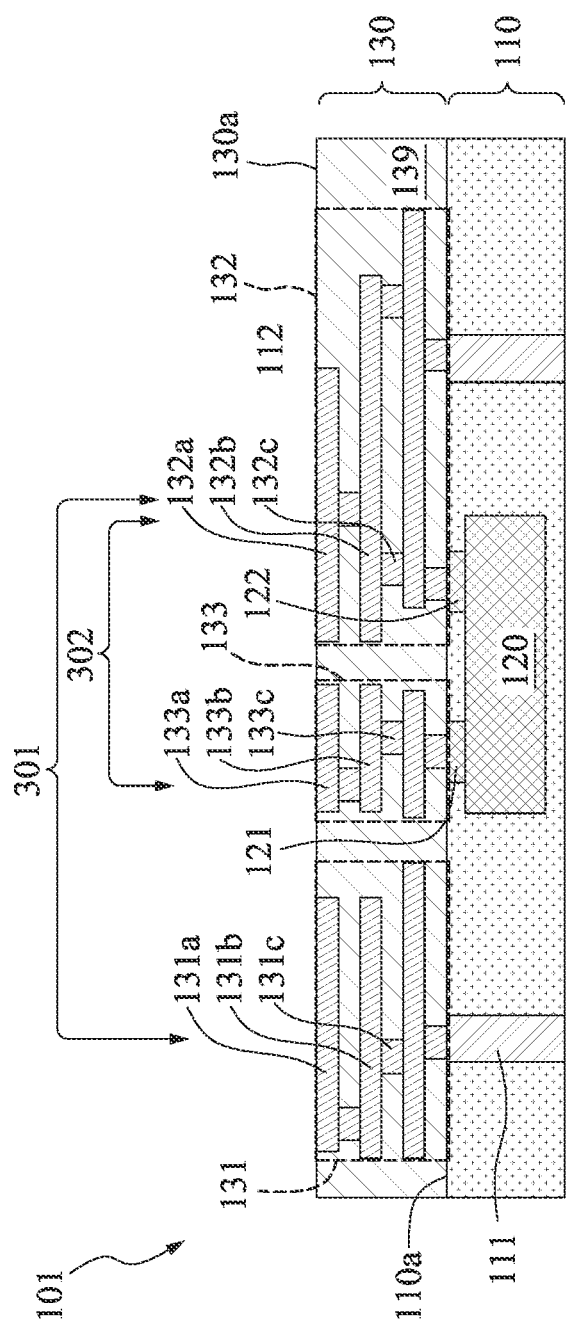
FIGS. 12 to 19 are cross-sectional views of one or more stages of the method of manufacturing a semiconductor structure in accordance with some embodiments of the present disclosure.

In operation 201, referring to FIG. 12, a first redistribution layer 130 is formed over a core layer 110. In some embodiments, a passive component 120 is embedded in the core layer 110. In some embodiments, a first interconnect 131 is disposed within the first redistribution layer 130 and electrically isolated from the passive component 120, a second interconnect 132 is disposed within the first redistribution layer 130, and a third interconnect 133 is disposed between the first interconnect 131 and the second interconnect 132 and electrically connected to the passive component 120. In some embodiments, the second interconnect 132 is electrically connected to the passive component 120.

In some embodiments, a first pad 131a of the first interconnect 131, a second pad 132a of the second interconnect 132 and a third pad 133a of the third interconnect 133 are formed and exposed through a first dielectric layer 139 of the first redistribution layer 130.

Figure 13:
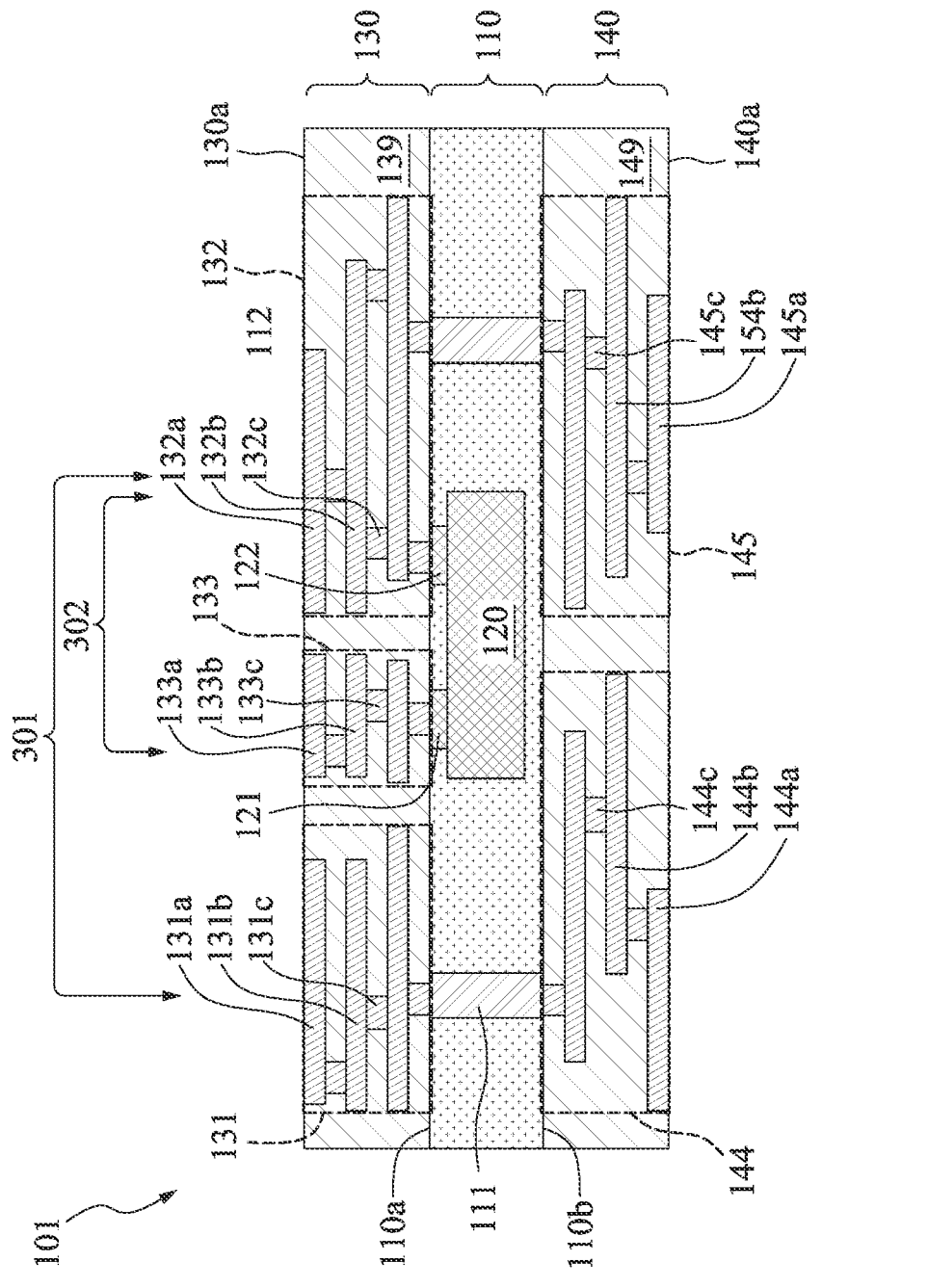

In some embodiments, referring to FIG. 13, a second redistribution layer 140 is formed under the core layer 110. In some embodiments, a fourth interconnect 144 is disposed within the second redistribution layer 140 and electrically connected to the first interconnect 131 through a first via 111, and a fifth interconnect 145 is disposed within the second redistribution layer 140 and electrically connected to the second interconnect 132 through a second via 112. In some embodiments, the fifth interconnect 145 is electrically connected to the passive component 120 through the second interconnect 132. In some embodiments, the first semiconductor structure 101 shown in FIGS. 1 and 2 is formed.

In some embodiments, a fourth pad 144a of the fourth interconnect 144 and a fifth pad 145a of the fifth interconnect 145 are formed and exposed through a second dielectric layer 149 of the second redistribution layer 140.

In operation 202, referring to FIGS. 12 and 13, a first bias 301 between the first interconnect 131 and the second interconnect 132 is provided. In some embodiments, the first bias 301 is provided to the first pad 131a and the second pad 132a. In some embodiments, the first bias 301 ranges between 50V and 400V. In some embodiments, the first bias 301 ranges between 150V and 300V.

In operation 203, referring to FIGS. 12 and 13, a second bias 302 between the second interconnect 132 and the third interconnect 133 is provided. In some embodiments, the first bias 301 and the second bias 302 are provided sequentially. In some embodiments, the second bias 302 is provided to the second pad 132a and the third pad 133a. In some embodiments, the second bias 302 is provided to the passive component 120 through the second interconnect 132 and the third interconnect 133. In some embodiments, the second bias 302 is less than the first bias 301. In some embodiments, the second bias 302 is less than 30V. In some embodiments, the second bias 302 is less than 10V. In some embodiments, the second bias 302 ranges between 0.5V and 5V.

Figure 14:
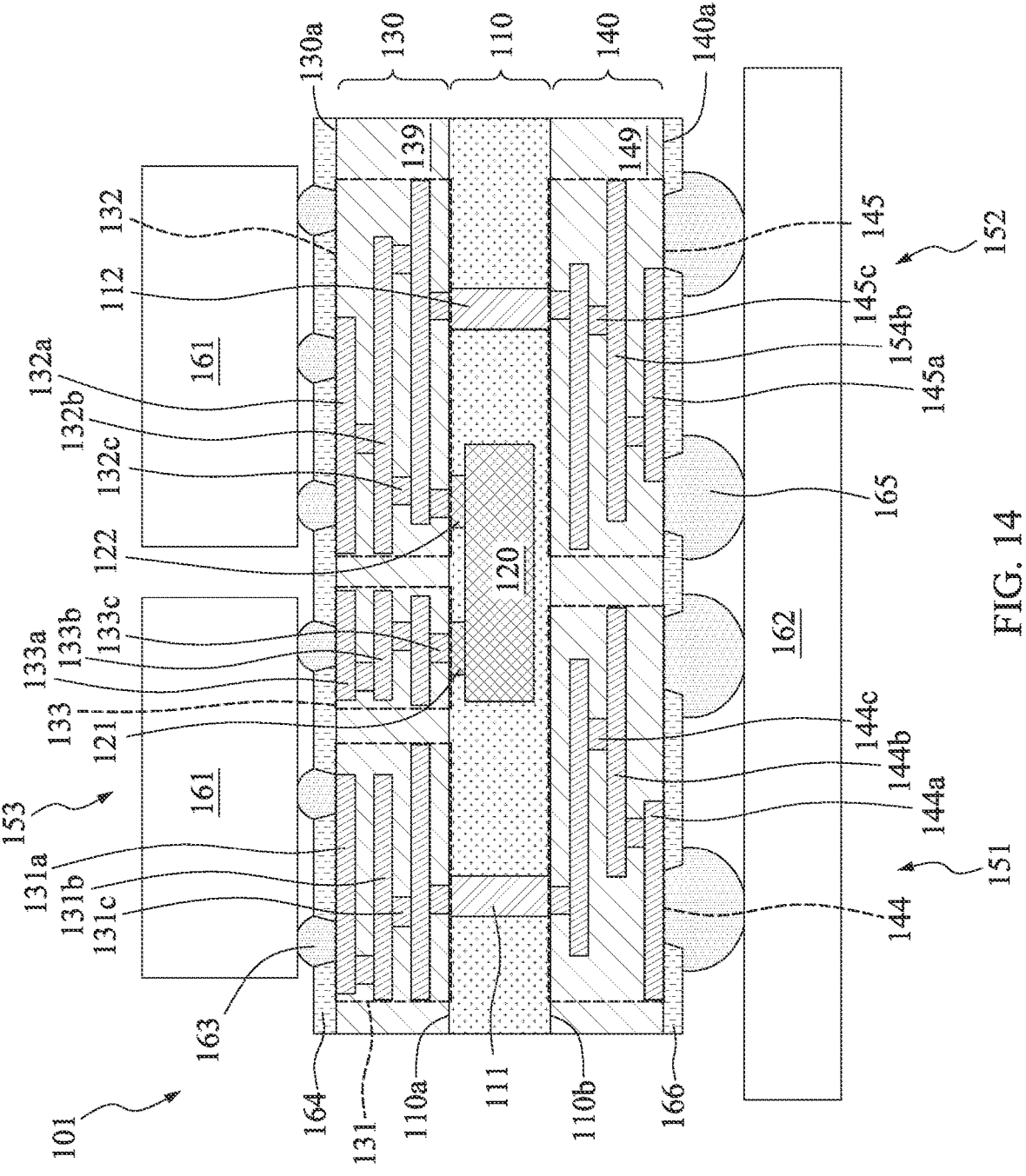

In some embodiments, referring to FIG. 14, after the first bias 301 and the second bias 302 are provided, the first redistribution layer 130 is electrically connected to a die 161 and the second redistribution layer 140 is electrically connected to a circuit board 162. In some embodiments, a conductive bump 163 and a passivation layer 164 are formed over a first side 130a of the first redistribution layer 130, and the die 161 is disposed over the conductive bump 163. In some embodiments, a conductive ball 165 and a passivation layer 166 are disposed over a second side 140a of the second redistribution layer 140, and the circuit board 162 is disposed over the conductive ball 165.

Figure 15:
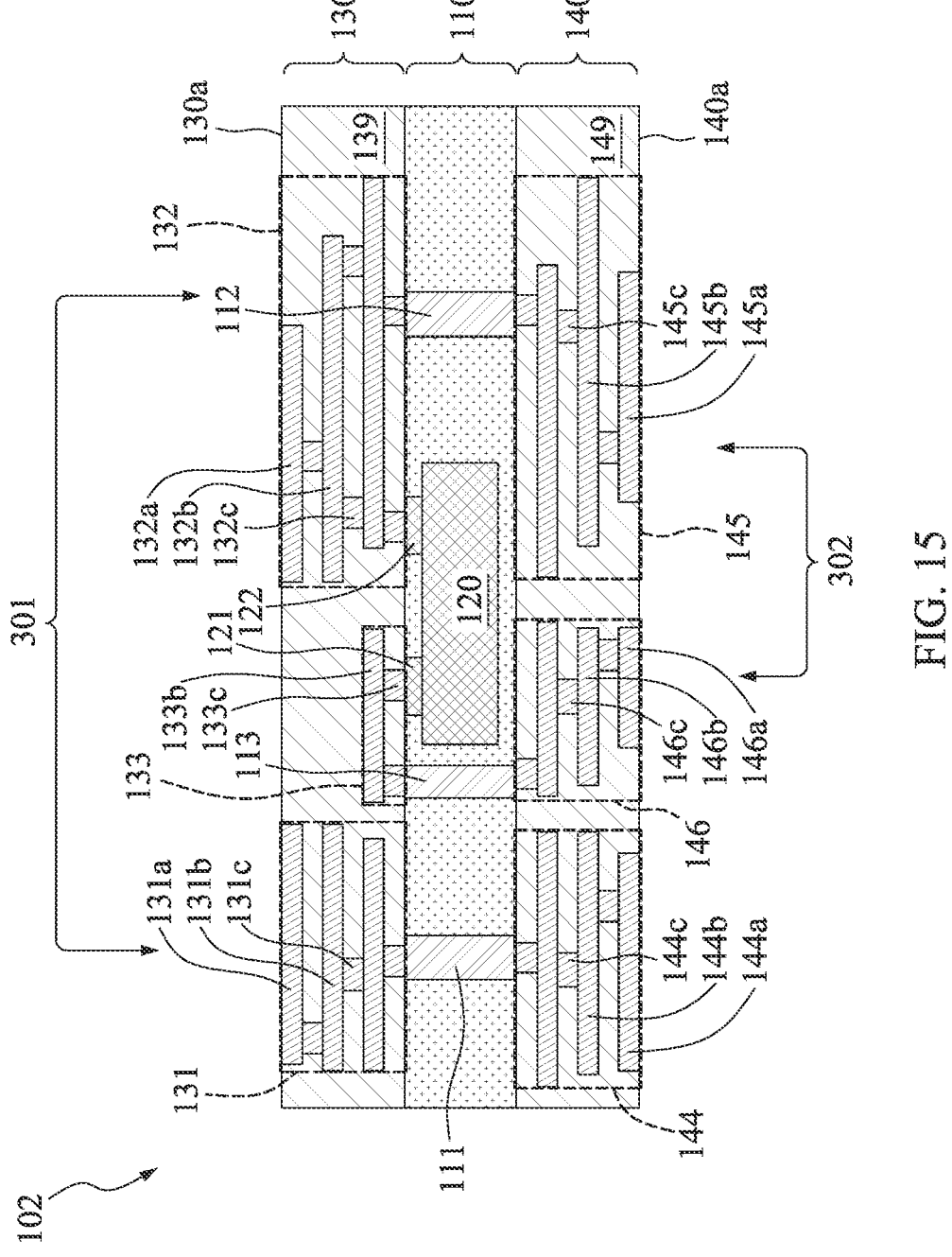

In some embodiments, referring to FIG. 15, the method 200 further includes forming a sixth interconnect 146 between the fourth interconnect 144 and the fifth interconnect 145 and within the second redistribution layer 140. In some embodiments, the sixth interconnect 146 is electrically connected to the third interconnect 133 and electrically isolated from the fourth interconnect 144 and the fifth interconnect 145. In some embodiments, the third interconnect 133 is formed within the first dielectric layer 139 and the third pad 133a of the third interconnect 133 is omitted. In some embodiments, the second semiconductor structure 102 shown in FIGS. 3 and 4 is formed.

In some embodiments, a sixth pad 146a of the sixth interconnect 146 is formed and exposed through the second dielectric layer 149 of the second redistribution layer 140. In some embodiments, the second bias 302 is provided to the passive component 120 through the sixth interconnect 146 and the fifth interconnect 145. In some embodiments, the second bias 302 is provided to the sixth pad 146a and the fifth pad 145a.

Figure 16:
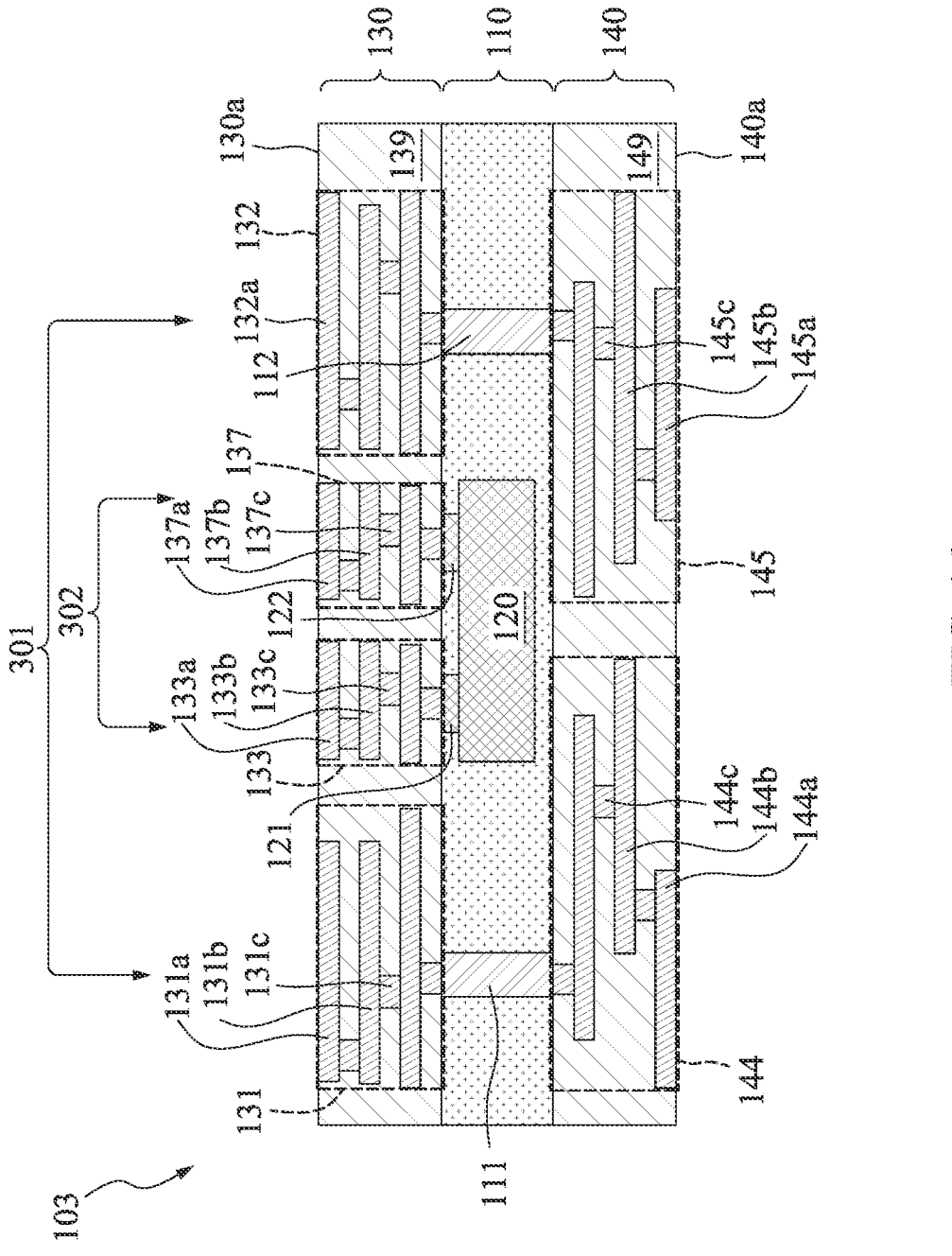

In some embodiments, referring to FIG. 16, the method 200 further includes forming a seventh interconnect 137 electrically connected to the passive component 120 and electrically isolated from the first interconnect 131 and the second interconnect 132. In some embodiments, seventh interconnect 137 is formed between the third interconnect 133 and the second interconnect 132. In some embodiments, the third semiconductor structure 103 shown in FIG. 5 is formed.

In some embodiments, a seventh pad 137a of the seventh interconnect 137 is formed and exposed through the first dielectric layer 139 of the first redistribution layer 130.

In some embodiments, the second bias 302 is provided to the passive component 120 through the third interconnect 133 and the seventh interconnect 137. In some embodiments, the first bias 301 and the second bias 302 are provided simultaneously. In some embodiments, the second bias 302 is provided to the third pad 133a and the seventh pad 137a.

Figure 17:
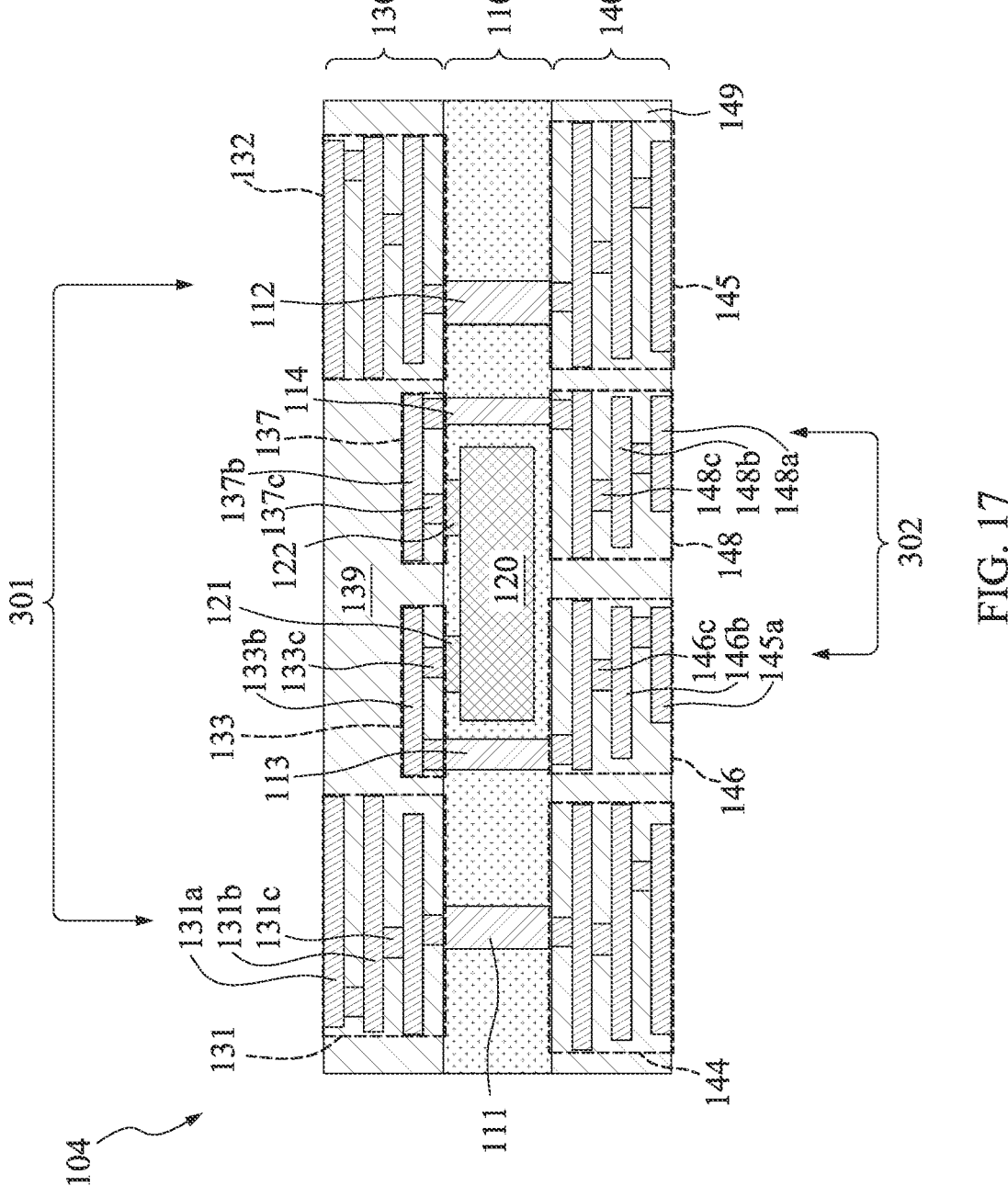

In some embodiments, referring to FIG. 17, the method 200 further includes forming the seventh interconnect 137 electrically connected to the passive component 120 and electrically isolated from the first interconnect 131 and the second interconnect 132, and forming an eighth interconnect 148 between the fourth interconnect 144 and the fifth interconnect 145 and within the second redistribution layer 140. In some embodiments, the eighth interconnect 148 is electrically connected to the seventh interconnect 137 through a fourth via 114 and electrically isolated from the fourth interconnect 144 and the fifth interconnect 145. In some embodiments, the seventh interconnect 137 is formed within the first dielectric layer 139, and the seventh pad 137*a* of the seventh interconnect 137 is omitted.

In some embodiments, the method 200 further includes forming the sixth interconnect 146 between the fourth interconnect 144 and the eighth interconnect 148 and within the second redistribution layer 140. In some embodiments, the sixth interconnect 146 is electrically connected to the third interconnect 133 through the third via 113 and electrically isolated from the fourth interconnect 144 and the fifth interconnect 145. In some embodiments, the third interconnect 133 is formed within the first dielectric layer 139, and the third pad 133*a* of the third interconnect 133 is omitted. In some embodiments, the fourth semiconductor structure 104 shown in FIG. 7 is formed.

In some embodiments, the sixth pad 146*a* of the sixth interconnect 146 and an eighth pad 148*a* of the eighth interconnect 148 are formed and exposed through the second dielectric layer 149 of the second redistribution layer 140.

In some embodiments, the second bias 302 is provided to the passive component 120 through the sixth interconnect 146 and the eighth interconnect 148. In some embodiments, the first bias 301 and the second bias 302 are provided simultaneously. In some embodiments, the second bias 302 is provided to the sixth pad 146*a* and the eighth pad 148*a*.

Figure 18:
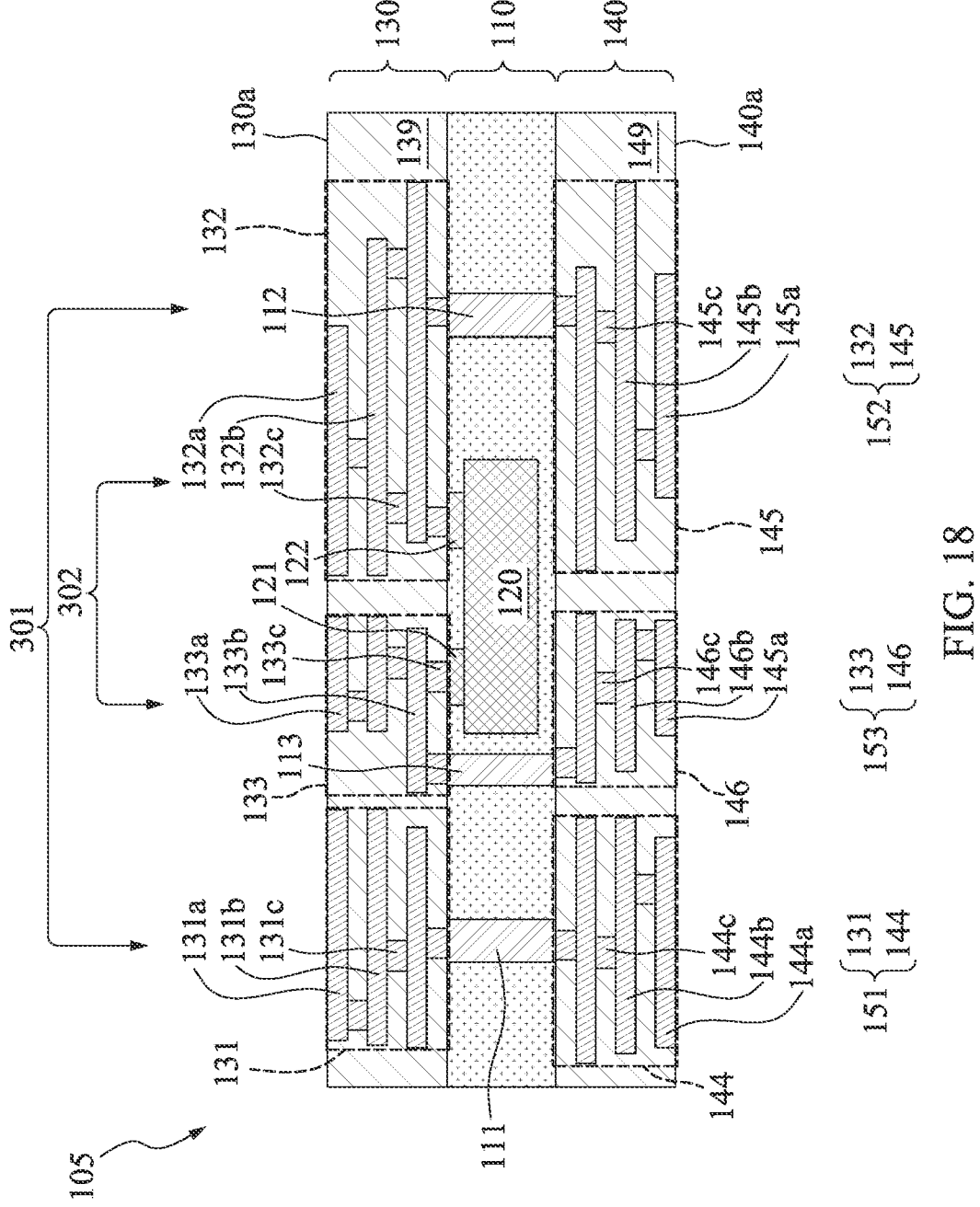

In some embodiments, referring to FIG. 18, the method 200 further includes forming the sixth interconnect 146 between the fourth interconnect 144 and the fifth interconnect 145 and within the second redistribution layer 140. In some embodiments, the sixth interconnect 146 is electrically connected to the third interconnect 133 and electrically isolated from the fourth interconnect 144 and the fifth interconnect 145. In some embodiments, the fifth semiconductor structure 105 shown in FIG. 8 is formed.

In some embodiments, a sixth pad 146*a* of the sixth interconnect 146 is formed and exposed through the second dielectric layer 149 of the second redistribution layer 140. In some embodiments, the second bias 302 is provided to the passive component 120 through the second interconnect 132 and the third interconnect 133. In some embodiments, the second bias 302 is provided to the second pad 132*a* and the third pad 133*a*.

Figure 19:
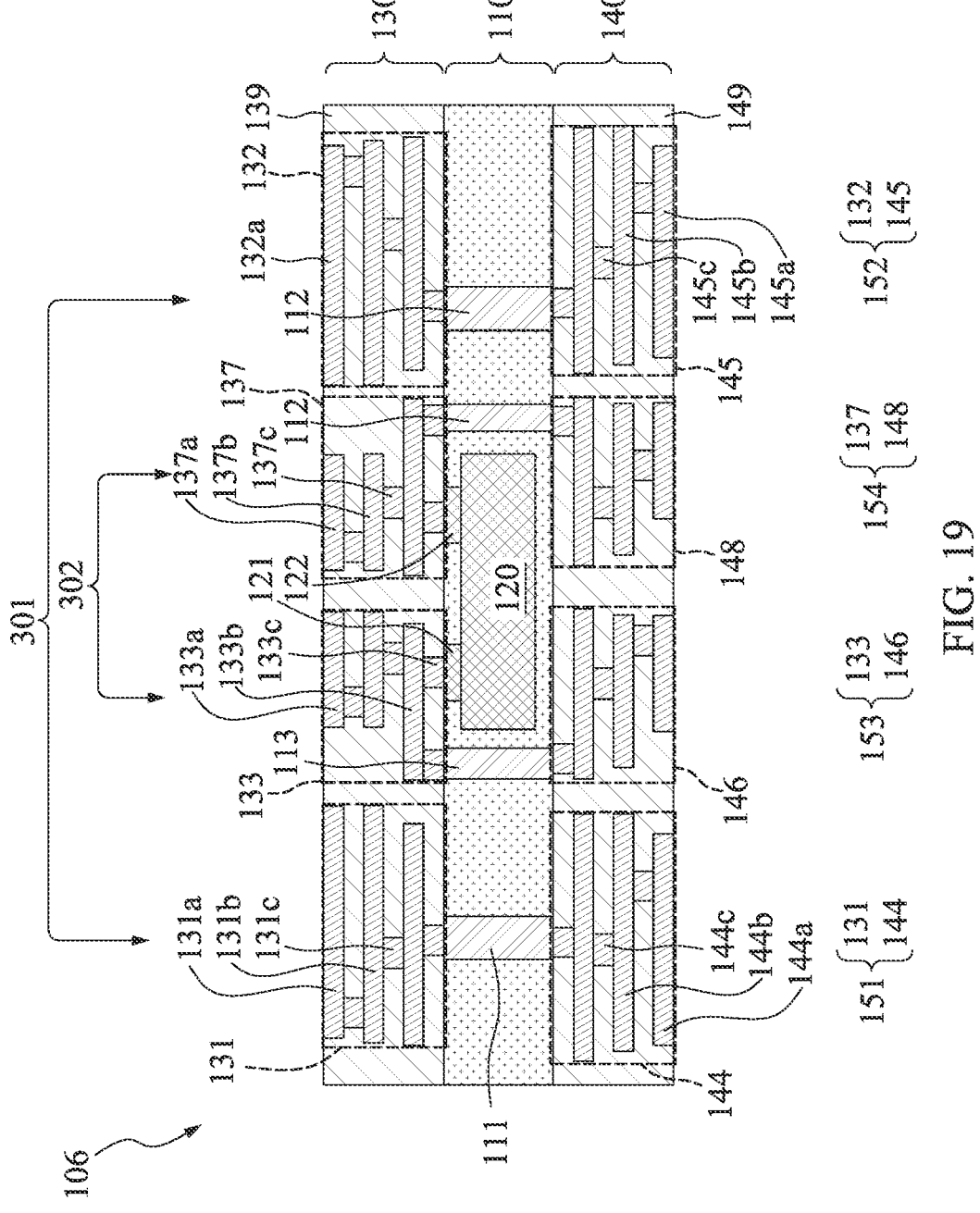

In some embodiments, referring to FIG. 19, the method 200 further includes forming the seventh interconnect 137, wherein the seventh interconnect 137 is electrically connected to the passive component 120 and electrically isolated from the first interconnect 131 and the second interconnect 132, and forming the eighth interconnect 148 between the fourth interconnect 144 and the fifth interconnect 145 and within the second redistribution layer 140, wherein the eighth interconnect 148 is electrically connected to the seventh interconnect 137 through the fourth via 114 and electrically isolated from the fourth interconnect 144 and the fifth interconnect 145.

In some embodiments, the method 200 further includes forming the sixth interconnect 146 between the fourth interconnect 144 and the eighth interconnect 148 and within the second redistribution layer 140, wherein the sixth interconnect 146 is electrically connected to the third interconnect 133 through the third via 113 and electrically isolated from the fourth interconnect 144 and the fifth interconnect 145. In some embodiments, the semiconductor structure 106 shown in FIG. 9 is formed.

In some embodiments, the third pad 133*a* of the third interconnect 133 and the seventh pad 137*a* of the seventh interconnect 137 are formed and exposed through the first dielectric layer 139 of the first redistribution layer 130, and the sixth pad 146*a* of the sixth interconnect 146 and the eighth pad 148*a* of the eighth interconnect 148 are formed and exposed through the second dielectric layer 149 of the second redistribution layer 140.

In some embodiments, the second bias 302 is provided to the passive component 120 through the third interconnect 133 and the seventh interconnect 137. In some embodiments, the first bias 301 and the second bias 302 are provided simultaneously. In some embodiments, the second bias 302 is provided to the third pad 133*a* and the seventh pad 137*a*.

One aspect of this disclosure relates to a semiconductor structure. The semiconductor structure includes a core layer; a passive component disposed within the core layer; and a first redistribution layer disposed over the core layer, wherein the first redistribution layer includes a first interconnect, a second interconnect, and a third interconnect disposed between and electrically isolated from the first interconnect and the second interconnect. The third interconnect is electrically connected to the passive component, and at least one of the first interconnect and the second interconnect is electrically isolated from the passive component.

In some embodiments, the first interconnect is electrically connected to a power source, and the second interconnect is electrically connected to an electrical ground. In some embodiments, the first interconnect includes a first pad exposed through a dielectric of the first redistribution layer, the third interconnect includes a third pad exposed through the dielectric of the first redistribution layer, and a size of the first pad is greater than a size of the third pad. In some embodiments, the semiconductor structure further includes a second redistribution layer disposed under the core layer, wherein the second redistribution layer includes a fourth interconnect electrically connected to the first interconnect and a fifth interconnect electrically connected to the second interconnect. In some embodiments, the second redistribution layer further includes a sixth interconnect electrically connected to the passive component through the third interconnect, and the sixth interconnect is disposed between and electrically isolated from the fourth interconnect and the fifth interconnect. In some embodiments, the first redistribution layer further includes a seventh interconnect electrically connected to the passive component, and the first interconnect and the second interconnect are electrically isolated from the seventh interconnect. In some embodiments, the third interconnect and the seventh interconnect are disposed between the first interconnect and the second interconnect. In some embodiments, the passive component overlaps the third interconnect from a top view perspective. In some embodiments, the second redistribution layer further includes an eighth interconnect electrically connected to the passive component and electrically isolated from the fourth interconnect and the fifth interconnect. In some embodiments, the second redistribution layer further includes a sixth interconnect electrically connected to the passive component through the third interconnect, and the first redistribution layer further includes a seventh interconnect electrically connected to the eighth interconnect and the passive component.

One aspect of this disclosure relates to a semiconductor structure. The semiconductor structure includes a core layer disposed between a first redistribution layer and a second redistribution layer; a passive component embedded in the core layer; a first interconnect disposed within the first redistribution layer and the second redistribution layer; a second interconnect disposed within the first redistribution layer and the second redistribution layer; and a third interconnect disposed between the first interconnect and the second interconnect. The first interconnect is electrically isolated from the passive component, the second interconnect and the third interconnect are electrically connected to the passive component, and a width of the first interconnect is greater than a width of the third interconnect.

In some embodiments, the third interconnect is disposed within the first redistribution layer and away from the second redistribution layer, and a pad of the third interconnect is exposed through the first redistribution layer. In some embodiments, the first redistribution layer includes a first side configured to electrically connect to a die, and the second redistribution layer includes a second side configured to electrically connect to a circuit board. In some embodiments, the first interconnect includes a first via extending through the core layer, and the second interconnect includes a second via extending through the core layer.

An aspect of this disclosure relates to a method of manufacturing a semiconductor structure. The method includes forming a first redistribution layer over a core layer, wherein a passive component is embedded in the core layer, a first interconnect is disposed within the first redistribution layer and electrically isolated from the passive component, a second interconnect is disposed within the first redistribution layer, and a third interconnect is disposed between the first interconnect and the second interconnect and electrically connected to the passive component; providing a first bias between the first interconnect and the second interconnect; and providing a second bias to the passive component through the third interconnect. The first bias is greater than the second bias.

In some embodiments, the first bias ranges between 50V and 400V, and the second bias is less than 30V. In some embodiments, the second interconnect is electrically connected to the passive component, and the second bias is provided to the passive component through the second interconnect and the third interconnect. In some embodiments, the first bias and the second bias are provided sequentially. In some embodiments, the method further includes forming a fourth interconnect electrically connected to the passive component and electrically isolated from the first interconnect and the second interconnect, and the second bias is provided to the passive component through the third interconnect and the fourth interconnect. In some embodiments, the first bias and the second bias are provided simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a core layer;
   a passive component disposed within the core layer; and
   a first redistribution layer disposed over the core layer, wherein the first redistribution layer includes a first interconnect, a second interconnect, and a third interconnect disposed between and electrically isolated from the first interconnect and the second interconnect, wherein the third interconnect is electrically connected to the passive component, and at least one of the first interconnect and the second interconnect is electrically isolated from the passive component.

2. The semiconductor structure of claim 1, wherein the first interconnect is electrically connected to a power source, and the second interconnect is electrically connected to an electrical ground.

3. The semiconductor structure of claim 1, wherein the first interconnect includes a first pad exposed through a dielectric of the first redistribution layer, the third interconnect includes a third pad exposed through the dielectric of the first redistribution layer, and a size of the first pad is greater than a size of the third pad.

4. The semiconductor structure of claim 1, further comprising:
   a second redistribution layer disposed under the core layer, wherein the second redistribution layer includes a fourth interconnect electrically connected to the first interconnect and a fifth interconnect electrically connected to the second interconnect.

5. The semiconductor structure of claim 4, wherein the second redistribution layer further includes a sixth interconnect electrically connected to the passive component through the third interconnect, and the sixth interconnect is disposed between and electrically isolated from the fourth interconnect and the fifth interconnect.

6. The semiconductor structure of claim 1, wherein the first redistribution layer further includes a seventh interconnect electrically connected to the passive component, and the first interconnect and the second interconnect are electrically isolated from the seventh interconnect.

7. The semiconductor structure of claim 6, wherein the third interconnect and the seventh interconnect are disposed between the first interconnect and the second interconnect.

8. The semiconductor structure of claim 1, wherein the passive component overlaps the third interconnect from a top view perspective.

9. The semiconductor structure of claim 4, wherein the second redistribution layer further includes an eighth interconnect electrically connected to the passive component and electrically isolated from the fourth interconnect and the fifth interconnect.

10. The semiconductor structure of claim 9, wherein the second redistribution layer further includes a sixth interconnect electrically connected to the passive component through the third interconnect, and the first redistribution layer further includes a seventh interconnect electrically connected to the eighth interconnect and the passive component.

11. A semiconductor structure, comprising:
    a core layer disposed between a first redistribution layer and a second redistribution layer;
    a passive component embedded in the core layer;
    a first interconnect disposed within the first redistribution layer and the second redistribution layer;
    a second interconnect disposed within the first redistribution layer and the second redistribution layer; and
    a third interconnect disposed between the first interconnect and the second interconnect,
    wherein the first interconnect is electrically isolated from the passive component, the second interconnect and the third interconnect are electrically connected to the passive component, and a width of the first interconnect is greater than a width of the third interconnect.

12. The semiconductor structure of claim 11, wherein the third interconnect is disposed within the first redistribution layer and away from the second redistribution layer, and a pad of the third interconnect is exposed through the first redistribution layer.

13. The semiconductor structure of claim 11, wherein the first redistribution layer includes a first side configured to electrically connect to a die, and the second redistribution layer includes a second side configured to electrically connect to a circuit board.

14. The semiconductor structure of claim 11, wherein the first interconnect includes a first via extending through the core layer, and the second interconnect includes a second via extending through the core layer.

15. A semiconductor structure, comprising:
a core layer;
a passive component disposed within the core layer; and
a first redistribution layer disposed over the core layer, wherein the first redistribution layer includes a first interconnect and a second interconnect electrically connected to the first interconnect through the passive component,
a second redistribution layer disposed under the core layer, wherein the second redistribution layer includes a third interconnect electrically connected to the first interconnect through a first via extending through the core layer.

16. The semiconductor structure of claim 15, wherein the first redistribution layer includes a fourth interconnect, the second interconnect is between and electrically isolated from the first interconnect and the fourth interconnect.

17. The semiconductor structure of claim 16, wherein the second redistribution layer includes a fifth interconnect electrically connected to the fourth interconnect through a second via extending through the core layer.

18. The semiconductor structure of claim 15, wherein the first interconnect includes a first pad exposed through a dielectric of the first redistribution layer, the second interconnect includes a second pad exposed through the dielectric of the first redistribution layer, and a size of the first pad is greater than a size of the second pad.

19. The semiconductor structure of claim 16, wherein the first interconnect is electrically connected to a power source, and the fourth interconnect is electrically connected to an electrical ground.

20. The semiconductor structure of claim 15, wherein the second redistribution layer includes a sixth interconnect electrically connected to the second interconnect through a third via extending through the core layer.

* * * * *